(12) United States Patent
Park et al.

(10) Patent No.: US 9,299,718 B2
(45) Date of Patent: Mar. 29, 2016

(54) SEMICONDUCTOR DEVICE AND METHOD OF FABRICATING THE SAME

(71) Applicants: Jintaek Park, Hwaseong-si (KR); Sunghoi Hur, Seoul (KR); Jang-Hyun You, Seoul (KR)

(72) Inventors: Jintaek Park, Hwaseong-si (KR); Sunghoi Hur, Seoul (KR); Jang-Hyun You, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/620,770

(22) Filed: Feb. 12, 2015

(65) Prior Publication Data
US 2015/0340376 A1 Nov. 26, 2015

(30) Foreign Application Priority Data
May 20, 2014 (KR) ........................ 10-2014-0060421

(51) Int. Cl.
*H01L 29/66* (2006.01)
*H01L 27/115* (2006.01)
*H01L 23/528* (2006.01)

(52) U.S. Cl.
CPC ........ *H01L 27/11582* (2013.01); *H01L 23/528* (2013.01); *H01L 27/11565* (2013.01)

(58) Field of Classification Search
CPC ............ H01L 23/528; H01L 27/11565; H01L 27/11582
USPC ....................................................... 257/329
See application file for complete search history.

(56) References Cited

U.S. PATENT DOCUMENTS

| 7,977,733 | B2 | 7/2011 | Shiino et al. |
| 8,541,831 | B2 | 9/2013 | Chae et al. |
| 8,797,777 | B2 | 8/2014 | Hishida et al. |
| 2009/0230450 | A1 | 9/2009 | Shiino et al. |
| 2010/0133599 | A1* | 6/2010 | Chae ................ H01L 27/11578 257/315 |
| 2011/0147818 | A1 | 6/2011 | Katsumata et al. |
| 2013/0003433 | A1 | 1/2013 | Hishida et al. |
| 2013/0100722 | A1 | 4/2013 | Shin |
| 2013/0161821 | A1 | 6/2013 | Hwang et al. |
| 2013/0248965 | A1* | 9/2013 | Nakai .................. H01L 29/788 257/315 |

FOREIGN PATENT DOCUMENTS

| JP | 2010-225694 A | 10/2010 |
| KR | 2011-0015337 A | 2/2011 |
| KR | 20150070746 A | 6/2015 |

* cited by examiner

*Primary Examiner* — Matthew Gordon
(74) *Attorney, Agent, or Firm* — Harness, Dickey & Pierce, P.L.C.

(57) ABSTRACT

According to example embodiments, a three-dimensional semiconductor device including a substrate with cell and connection regions, gate electrodes stacked on the cell region, a vertical channel structure, pads, a dummy pillar, and first and second semiconductor patterns. The vertical channel structure penetrates the gate electrodes on a lowermost gate electrode and includes a first gate dielectric pattern. The pads extend from the gate electrodes and are stacked on the connection region. The dummy pillar penetrates some of the pads on a lowermost pad and includes a second gate dielectric pattern. The first semiconductor patterns are between the vertical channel structure and the substrate. The second semiconductor patterns are between the dummy pillar and the substrate. The first and second gate dielectric patterns may be on the first and second semiconductor patterns, respectively. The second gate dielectric pattern may cover a whole top surface of the second semiconductor pattern.

20 Claims, 35 Drawing Sheets

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2014-0060421, filed on May 20, 2014, in the Korean Intellectual Property Office, the entire contents of which are hereby incorporated by reference.

BACKGROUND

Example embodiments of inventive concepts relate to a three-dimensional semiconductor device and a method of fabricating the same.

Higher integration of semiconductor devices is desired to satisfy demands for superior performance and inexpensive prices. Especially, in the case of memory devices, integration may affect product prices. In the case of typical two-dimensional memory devices, integration may be determined by the area occupied by a unit memory cell. Thus, integration of the two-dimensional memory devices may be strongly influenced by fine pattern forming technology. However, process equipment for increasing pattern fineness may be very expensive and therefore can set a practical limitation on increasing integration for two-dimensional or planar semiconductor devices. Accordingly, semiconductor memory devices including three-dimensionally arranged memory cells have been proposed.

SUMMARY

Example embodiments of inventive concepts provide a three-dimensional semiconductor device with improved electric characteristics.

Example embodiments of inventive concepts also relate to a method of fabricating a three-dimensional semiconductor device with improved electric characteristics.

According to example embodiments of inventive concepts, a three-dimensional semiconductor device may include a substrate including a cell region and a connection region; gate electrodes stacked on top of each other on the cell region of the substrate, the gate electrodes including a lowermost gate electrode; a vertical channel structure penetrating the gate electrodes on top of the lowermost gate electrode, the vertical channel structure including a first gate dielectric pattern; pads extended from the gate electrodes, the pads stacked on top of each other on the connection region of the substrate, the pads including a lowermost pad; a dummy pillar penetrating at least some of the pads on top of the lowermost pad, the dummy pillar including a second gate dielectric pattern; a first semiconductor pattern disposed between the vertical channel structure and the substrate, the first gate dielectric pattern of the vertical channel structure on the first semiconductor pattern, the first semiconductor pattern penetrating the lowermost gate electrode; and a second semiconductor pattern between the dummy pillar and the substrate. The dummy pillar penetrates the lowermost pad. The second gate dielectric patterns of the dummy pillar cover a whole top surface of the second semiconductor pattern.

In example embodiments, the vertical channel structure may further include a first vertical channel pattern and an insulating filling pattern on the first gate dielectric pattern.

In example embodiments, the first vertical channel pattern may be in direct contact with the first semiconductor pattern, and the first vertical channel pattern may be electrically connected to the substrate through the first semiconductor pattern.

In example embodiments, a top surface of the first semiconductor pattern may include a recessed dent. The top surface of the first semiconductor pattern may be positioned at a higher level than a top surface of the lowermost gate electrode.

In example embodiments, the dummy pillar may further include a second vertical channel pattern on the second gate dielectric pattern. The second gate dielectric pattern may define an inner space of the dummy pillar. The second vertical channel pattern may completely fill the inner spaced of the dummy pillar defined by the second gate dielectric pattern. The second vertical channel pattern may be separated from the second semiconductor pattern by the second gate dielectric pattern. The second vertical channel pattern may be electrically insulated from the substrate by the second gate dielectric pattern. The top surface of the second semiconductor pattern may be flat.

In example embodiments, the dummy pillar may be on or across a boundary between adjacent ones of the pads.

In example embodiments, the vertical channel structure may have a circular top surface and the dummy pillar may have an elliptical top surface. A short diameter of the elliptical top surface of the dummy pillar may be in a range from 50% to 90% of a diameter of the circular top surface of the vertical channel structure.

In example embodiments, the vertical channel structure and the dummy pillar may have circular top surfaces. A diameter of the circular top surface of the dummy pillar may be smaller than or equal to 50% of a diameter of the circular top surface of the vertical channel structure.

In example embodiments, the pads may have horizontal lengths decreasing in a direction away from the substrate.

In example embodiments, contact plugs may be electrically connected to the pads.

According to example embodiments of inventive concepts, a three-dimensional semiconductor device may include a substrate including a cell region and a connection region; gate electrodes stacked on top of each other on the cell region of the substrate, the gate electrodes defining a part of a channel hole that exposes a part of the cell region of the substrate, the gate electrodes being separated from each other in a vertical direction; pads extended from the gate electrodes, the pads stacked on top of each other on the connection region of the substrate, at least some of the pads defining a part of a dummy hole that exposes a part of the connection region of the substrate; a first semiconductor pattern on the cell region of the substrate in a lower portion of the channel hole, a top surface of the first semiconductor pattern including a recessed dent; a second semiconductor pattern on the connection region of the substrate in a lower portion of the dummy hole. The second semiconductor pattern may have a flat top surface.

In example embodiments, a vertical channel structure may be on the first semiconductor pattern over the cell region of the substrate. The vertical channel structure may include a first gate dielectric pattern, a first vertical channel pattern, and an insulating filling pattern. The first vertical channel pattern may be in direct contact with the first semiconductor pattern.

In example embodiments, a dummy pillar may be on the second semiconductor pattern over the connection region of the substrate. The dummy pillar may consist of a second gate dielectric pattern and a second vertical channel pattern. The second vertical channel pattern may be electrically insulated from the second semiconductor pattern by the second gate dielectric pattern.

According to example embodiments of inventive concepts, a method of fabricating a three-dimensional semiconductor device may include alternatingly and repeatedly stacking interlayered insulating layers and sacrificial layers on top of each other on a substrate with a cell region and a connection region; forming a channel hole and a dummy hole through the interlayered insulating layers and the sacrificial layers, the channel hole exposing a part of the cell region of the substrate, the dummy hole exposing a part of the connection region of the substrate, the channel hole and the dummy hole being spaced apart from each other; forming first and second semiconductor patterns, the first semiconductor pattern filling a lower portion of the channel hole, the second semiconductor pattern filling a lower portion of the dummy hole; forming a gate dielectric layer in the channel and dummy holes; forming a first gate dielectric pattern in the channel hole and a second gate dielectric pattern in the dummy hole by anisotropically etching the gate dielectric layer. The first gate dielectric pattern may be formed to have a spacer shape that covers a sidewall of the channel hole and partially exposes a top surface of the first semiconductor pattern in the channel hole. The second gate dielectric pattern may be formed to cover a sidewall of the dummy hole and a whole top surface of the second semiconductor pattern in the dummy hole.

In example embodiments, the method may further include forming a first vertical channel pattern. The first vertical channel pattern may cover the first gate dielectric pattern and the exposed top surface of the first semiconductor pattern. The method may further include forming an insulating filling pattern in a remaining space of the channel hole defined by the first vertical channel pattern. The insulating filling pattern may be a portion of a vertical channel structure in the channel hole. The first vertical channel pattern may be in direct contact with the first semiconductor pattern.

In example embodiments, the method may further include forming a second vertical channel pattern to fill a remaining space of the second gate dielectric pattern. The second vertical channel pattern may be a portion of a dummy pillar in the dummy hole. The second vertical channel pattern may be separated from the second semiconductor pattern by the second gate dielectric pattern.

In example embodiments, the forming the first gate dielectric pattern may include etching a top surface of the first semiconductor pattern in the channel hole and may form a recessed dent in the top surface of the first semiconductor pattern.

According to example embodiments, a three-dimensional semiconductor device may include: a substrate including a cell region and a connection region; a plurality of conductive layers stacked on top of each other on the substrate and spaced apart from each other in a vertical direction, the conductive layers each including a gate electrode portion over the cell region and a pad portion over the connection region; a first semiconductor pattern on a part of the cell region, the first semiconductor pattern extending vertically through the gate electrode portion of a lowermost conductive layer among the plurality of conductive layers; a first vertical channel pattern extending vertically through the gate electrode portions of the conductive layers over the lowermost conductive layer, the first vertical channel pattern electrically connected to the first semiconductor pattern; a second semiconductor pattern on a part of the connection region and extending vertically through the pad portion of the lowermost conductive layer; a dummy gate dielectric pattern extending vertically through the pad portions of some of the conductive layers over the lowermost conductive layer, the dummy gate dielectric pattern cover a whole top surface of the second semiconductor pattern.

In example embodiments, the device may further include a cell region gate dielectric pattern between the first vertical channel pattern the gate electrode portions of the conductive layers on the lowermost conductive layer. The cell region gate dielectric pattern may be on top of the first semiconductor pattern. The cell region gate dielectric pattern and the first vertical channel pattern may define a vertical channel structure. The vertical channel structure may have a circular top surface. An outer periphery of the dummy gate dielectric pattern may have an elliptical top surface. A short diameter of the elliptical top surface of the outer periphery of the dummy gate dielectric pattern may be in a range of 50% to 90% of a diameter of the circular top surface of the vertical channel structure.

In example embodiments, the pad portions of the conductive layers may define a staircase structure over the connection region.

BRIEF DESCRIPTION OF THE DRAWINGS

The foregoing and other features of example embodiments of inventive concepts will be more clearly understood from the following brief description taken in conjunction with the accompanying drawings. The accompanying drawings represent non-limiting embodiments as described herein.

Figure 1:
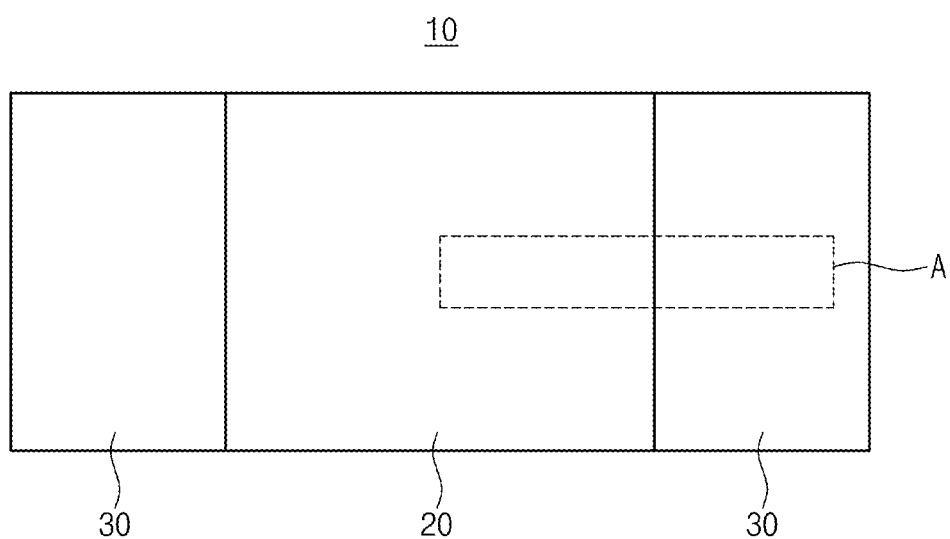
FIG. 1 is a plan view of a three-dimensional semiconductor device according to example embodiments of inventive concepts.

It should be noted that these figures are intended to illustrate the general characteristics of methods, structure and/or materials utilized in certain example embodiments and to supplement the written description provided below. These drawings are not, however, may not necessarily be illustrated to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which some example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view of a three-dimensional semiconductor device according to example embodiments of inventive concepts.

Referring to FIG. 1, a three-dimensional semiconductor device may include a memory cell array 10 provided with memory cells and a peripheral circuit (not shown) provided around the memory cell array 10. The peripheral circuit may include functional circuits for operating or driving the memory cells. The memory cell array 10 may include a cell region 20 and at least one connection region 30 disposed adjacent to the cell region 20. The memory cells may be three-dimensionally arranged on the cell region 20, and interconnection structures may be provided on the connection region 30 to connect the memory cells with the peripheral circuit. In example embodiments, the connection region 30 may be provided at one or opposite two of sides of the cell region 20.

Figure 2:
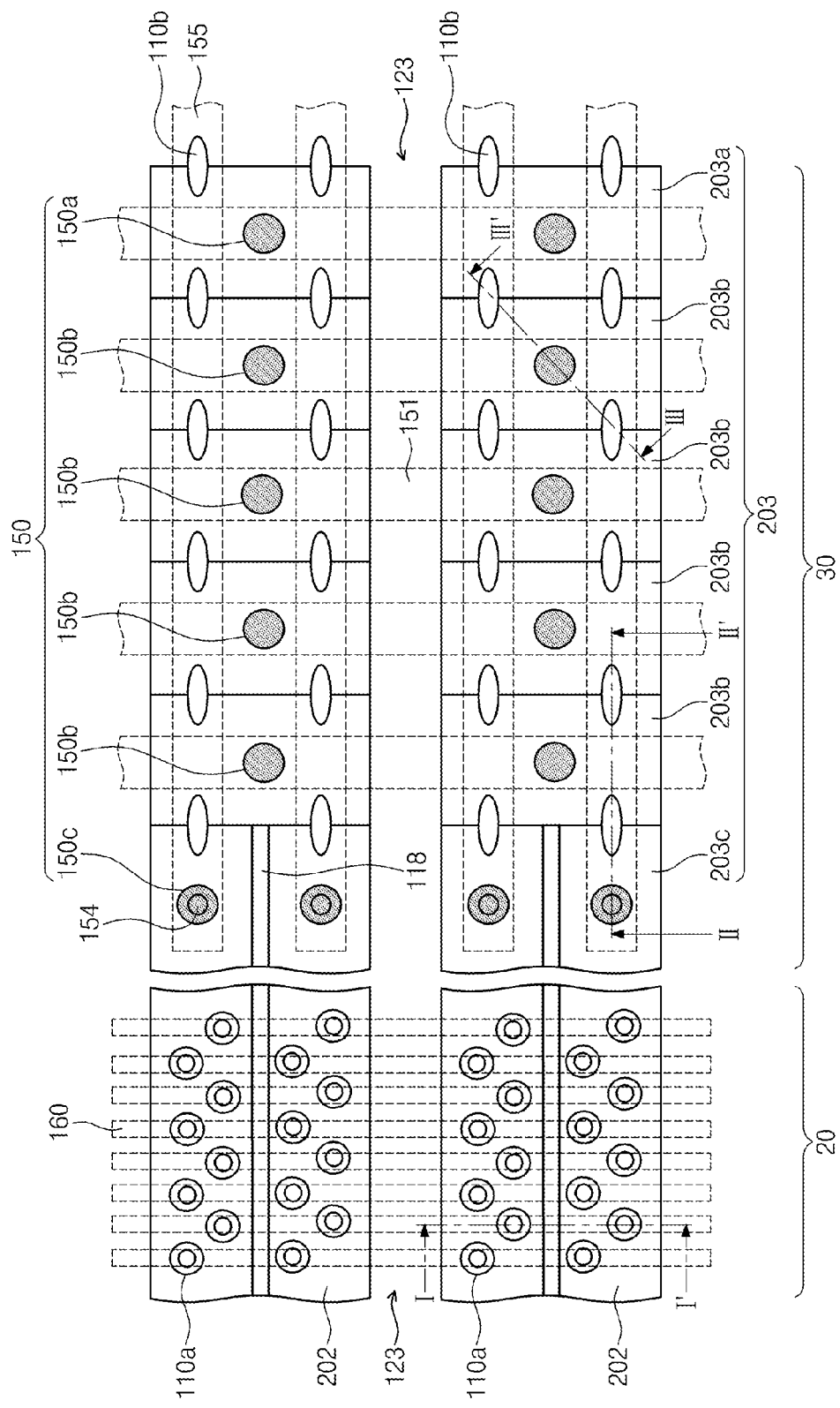
FIG. 2 is an enlarged plan view illustrating a region A of the three-dimensional semiconductor device of FIG. 1.
Figure 3:
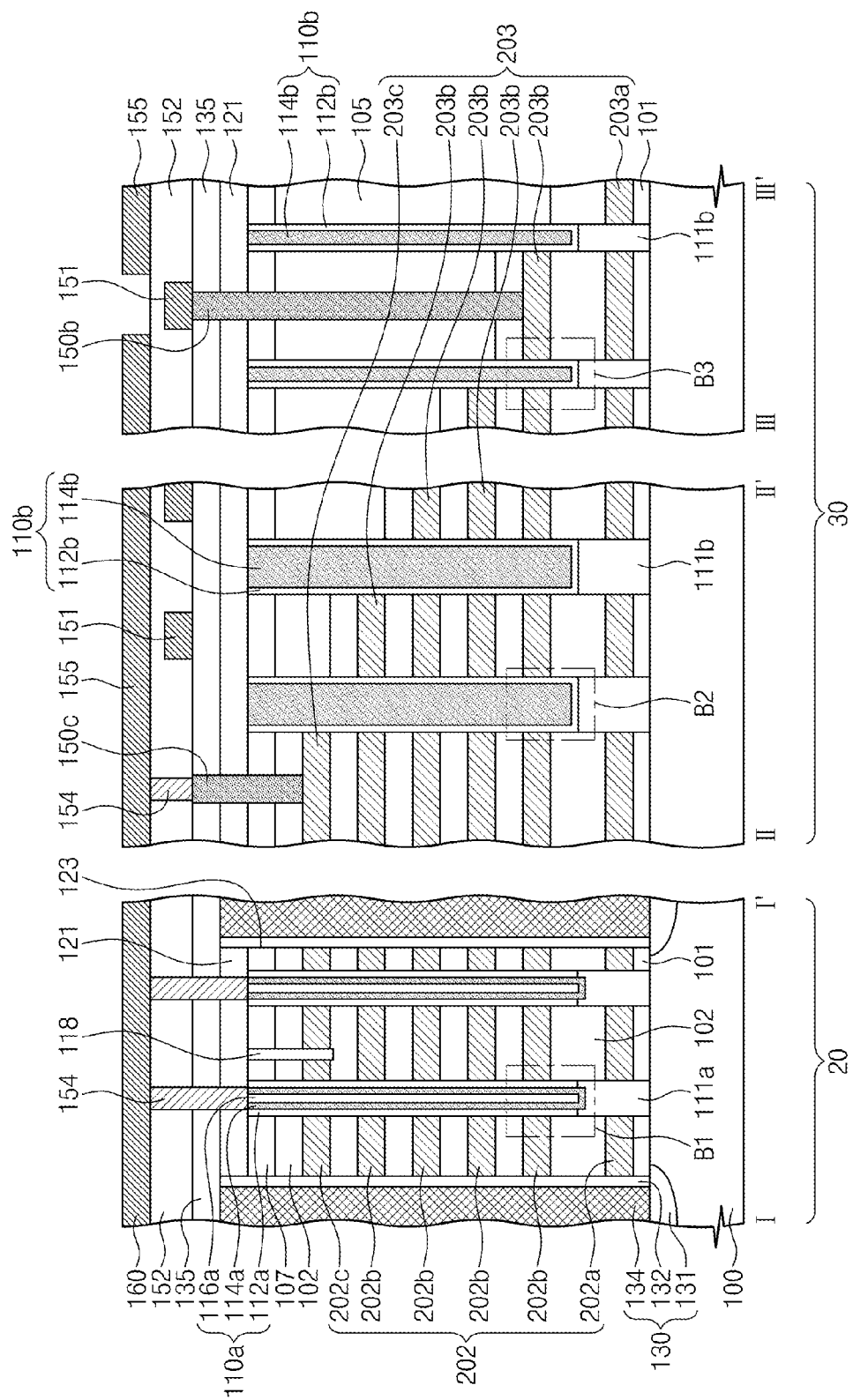
FIG. 3 is a sectional view illustrating sections taken along lines I-I', II-II', and III-III' of FIG. 2.

FIG. 2 is an enlarged plan view illustrating a region A of the three-dimensional semiconductor device of FIG. 1 and is provided to describe the three-dimensional semiconductor device according to example embodiments of inventive concepts. FIG. 3 is a sectional view illustrating sections taken along lines I-I', II-II', and III-III' of FIG. 2.

Referring to FIGS. 2 and 3, as described above, the three-dimensional semiconductor device may include the cell region 20 and the connection region 30. The three-dimensional semiconductor device may include gate electrodes 202, interlayered insulating layers 102, vertical channel structures 110a, and common source structures 130, which are provided on the cell region 20. Further, the three-dimensional semiconductor device may include pads 203, dummy pillars 110b, contact plugs 150, and a capping insulating layer 105, which are provided on the connection region 30. In addition, the three-dimensional semiconductor device may further include first and second semiconductor patterns 111a and 111b, a buffer insulating layer 101, first to fourth upper interlayered insulating layers 107, 121, 135, and 152, a first metal line 151, a second metal line 155, a connection plug 154, and bit lines 160, which are provided on the cell region 20 and the connection region 30.

The gate electrodes 202 and the interlayered insulating layers 102 may be provided to enclose sidewalls of the vertical channel structures 110a and extend in a first direction. The gate electrodes 202 and the interlayered insulating layers 102 may extend from the cell region 20 to the connection region 30. The gate electrodes 202 may be electrically separated from each other by the interlayered insulating layers 102. In example embodiments, the gate electrodes 202 may include at least one ground selection gate electrode 202a, a plurality of cell gate electrodes 202b, and two string selection gate electrodes 202c. The ground selection gate electrode 202a may be the lowermost one of the gate electrodes 202, and the string selection gate electrodes 202c may be the uppermost one of the gate electrodes 202. The two string selection gate electrodes 202c may be separated from each other by a cutting insulating pattern 118. The cell gate electrodes 202b may be stacked between the ground and string selection gate electrodes 202a and 202c. The cell gate electrodes 202b may have substantially the same thicknesses, but example embodiments are not limited thereto and, although not illustrated, some of the cell gate electrodes 202b may alternatively have different thicknesses from each other. At least one of the ground and string selection gate electrodes 202a and 202c may have a different thickness from the cell gate electrodes 202b. For example, the ground and string selection gate electrodes 202a and 202c may be thicker than the cell gate electrodes 202b. In example embodiments, the cell gate electrodes 202b may serve as word lines. Further, the ground selection gate electrode 202a may serve as a ground selection line, and the string selection gate electrodes 202c may serve as string selection lines. The gate electrodes 202 may be formed of or include a metallic material (e.g., tungsten, copper, or metal silicides). Although FIG. 3 illustrates an example where one ground selection gate electrode 202a is between the substrate 100 and the cell gate electrodes 202b, example embodiments are not limited thereto and two or more ground selection gate electrodes 202a may alternatively be stacked on top of each other between the substrate 100 and the cell gate electrodes 202b, provided that an interlayer insulating layer 102 is between every two of the ground selection gate electrodes 202a. Similarly, the number of cell gate electrodes 202a and interlayer insulating layers 102 alternately stacked on top of each other may vary. Similarly, at least one more layer including the two string selection gate electrodes 202c separated by the cutting insulating pattern 118 may be on top of the interlayer insulating layer 102 shown above the string selection gate electrodes 202c in FIG. 3.

At least two of the interlayered insulating layers 102 may have different thicknesses from each other. For example, the lowermost one of the interlayered insulating layers 102 may be thicker than the others of the interlayered insulating layers 102. The interlayered insulating layers 102 may be formed of or include an insulating material (e.g., silicon oxide, silicon nitride, or silicon oxynitride). The gate electrodes 202 and the interlayered insulating layers 102 may be alternatingly stacked on the cell region 20.

Each of the vertical channel structures 110a may penetrate the gate electrodes 202 and the interlayered insulating layers 102 in a vertical direction and thereby be in contact with the first semiconductor pattern 111a. Each of the vertical channel structures 110a may include a first gate dielectric pattern 112a, a first vertical channel pattern 114a, and an insulating filling pattern 116a. The first vertical channel pattern 114a may be electrically connected to a substrate 100 via the first semiconductor pattern 111a. Alternatively, the insulating filling pattern 116a may be omitted and the first semiconductor pattern 111a may further fill the space where the insulating filling pattern 116a is illustrated in FIG. 3.

As shown in FIG. 2, when viewed in plan view, the vertical channel structures 110a may be two-dimensionally arranged on the substrate 100. For example, the vertical channel structures 110a may be provided to have a zigzag arrangement. The vertical channel structure 110a will be described in more detail with reference to FIGS. 4A and 4B.

The common source structure 130 may penetrate the gate electrodes 202 and the interlayered insulating layers 102 in the vertical direction. The common source structure 130 may include a common source region 131, a spacer 132, and a common source line 134. The common source region 131 may be formed in the substrate 100. The common source region 131 may contain impurities (e.g., P or As) that are injected in the substrate 100. The common source line 134 may penetrate the gate electrodes 202 and the interlayered insulating layers 102 in the vertical direction and thereby be in contact with the common source region 131. The common source line 134 may be a dam-shaped structure. For example, when viewed in a top plan view, the common source line 134 may be shaped like a line or bar extending along the first direction. The spacer 132 may be provided between the common source line 134 and the interlayered insulating layers 102 and between the common source line 134 and the gate electrodes 202. For example, the spacer 132 may disposed on sidewalls of the common source line 134. Due to the spacer 132, the common source line 134 may be electrically insulated from the gate electrodes 202. The spacer 132 may be formed of or include an insulating material (e.g., silicon oxide, silicon nitride, or silicon oxynitride).

The pads 203 and the interlayered insulating layers 102 may be alternatingly stacked on the connection region 30. The pads 203 may include a ground selection pad 203a, cell pads 203b, and string selection pads 203c. The ground selection pad 203a, the cell pads 203b, and the string selection pads 203c may be extensions of the ground selection gate electrode 202a, the cell gate electrodes 202b, and the string selection gate electrodes 202c, respectively, which are provided on the cell region 20, and may be provided to form a staircase structure on the connection region 30. The cell pads 203b may be provided between the ground selection pad 203a and the string selection pads 203c. Each of the interlayered insulating layers 102 may include a portion extending from the cell region 20 to the connection region 30 and covering a corresponding one of the pads 203. Accordingly, horizontal lengths of the pads 203 may be different from each other. For example, the horizontal lengths of the pads 203 may decrease in a direction away from the substrate 100. As an example, the ground selection pad 203a, the lowermost one of the gate electrodes 202, has the longest horizontal length, and the string selection pads 203c, the uppermost one of the gate electrodes 202, has the shortest horizontal length.

In FIG. 3, a plurality of conductive layers may be vertically stacked on top of each other and spaced apart from each other in a vertical direction. Each conductive layer may include a gate electrode 202 over the cell region 20 and a pad 203 over the connection region 30.

Although FIG. 3 illustrates an example where one ground selection pad 203a is between the substrate 100 and the cell pads 203b, example embodiments are not limited thereto and two or more ground selection pads 203a may alternatively be stacked on top of each other between the substrate 100 and the cell pads 203b, provided that an interlayer insulating layer 102 is between every two of the ground selection pads 203a. Similarly, the number of cell pads 203b and interlayer insulating layers 102 alternately stacked on top of each other may vary. Similarly, at least one more string selection pad 203c may be on top of the string selection pad 203c illustrated in FIG. 3, provided than an interlayer insulating layer 102 is in between.

The contact plugs 150 may penetrate the capping insulating layer 105 and the first to third upper interlayered insulating layers 107, 121, and 135 in the vertical direction and may connect the pads 203 electrically to the first and second metal lines 151 and 155. The contact plugs 150 may include a ground selection plug 150a, cell plugs 150b, and string selection plugs 150c. The ground selection plug 150a may be connected to the ground selection pad 203a through the first to third interlayered insulating layer 107, 121, and 135, the capping insulating layer 105, and the lowermost one of the interlayered insulating layers 102. The cell and string selection plugs 150b and 150c may be connected to the cell and string selection pads 203b and 203c, respectively. Since the pads 203 form the staircase structure, the contact plugs 150 connected to the pads 203, respectively, may have different vertical lengths. For example, the ground selection plug 150a connected to the lowermost ground selection pad 203a may have the longest vertical length, and the string selection plugs 150c connected to the uppermost string selection pad 203c may have the shortest vertical length.

Referring to FIG. 2, the cell and ground selection plugs 150b and 150a may be disposed on a virtual straight line crossing centers of the cell and ground selection pads 203b and 203a. The string selection plugs 150c may be disposed on the string selection pads 203c, respectively, with the cutting insulating pattern 118 interposed therebetween.

The dummy pillars 110b may penetrate the pads 203 and the interlayered insulating layers 102 and be in contact with the second semiconductor patterns 111b, respectively. The dummy pillars 110b may include a second gate dielectric pattern 112b and a second vertical channel pattern 114b. The dummy pillars 110b may have top surfaces positioned at the same level as those of the vertical channel structures 110a. The dummy pillars 110b may be disposed on or across a boundary between adjacent ones of the pads 203. As shown in FIG. 2, when viewed in plan view, the dummy pillars 110b penetrating the pads 203 may be arranged to environ or besiege each of the contact plugs 150 connected to the pads 203. The first gate dielectric pattern 112a may also be referred to as a cell region gate dielectric pattern 112a. The second gate dielectric pattern 112b may also be referred to as a dummy gate dielectric pattern 112b.

The dummy pillars 110b may be different from the vertical channel structures 110a, in terms of shape and structure. For example, the top surface of the dummy pillar 110b may have an elliptical shape or a circular shape, while a top surface of the vertical channel structure 110a may have a circular shape. In addition, the vertical channel structures 110a may be configured to include the insulating filling pattern 116a, while the dummy pillars 110b may be configured not to include the insulating filling pattern. The dummy pillars 110b will be described in more detail with reference to FIGS. 4A and 4B.

The first semiconductor pattern 111a may be interposed between the vertical channel structure 110a and the cell region 20 of the substrate 100 and may have a structure protruding upward from the substrate 100. A top surface of the first semiconductor pattern 111a may be positioned at a higher level than that of the lowermost one of the gate electrodes 202. The first semiconductor pattern 111a may be in direct contact with the first vertical channel pattern 114a. The top surface of the first semiconductor pattern 111a may include a recessed region in direct contact with the first vertical channel pattern 114a. Further, the second semiconductor pattern 111b may be interposed between the dummy pillars 110b and the connection region 30 of the substrate 100 and may have a structure protruding from the substrate 100. A top surface of the second semiconductor pattern 111b may be positioned at a higher level than that of the lowermost one of the pads 203. The second semiconductor pattern 111b may be separated from the second vertical channel pattern 114b. In other words, the first vertical channel pattern 114a may be electrically connected to the substrate 100 through the first semiconductor pattern 111a, while the second vertical channel pattern 114b may be electrically insulated from the substrate 100. The first and second semiconductor patterns 111a and 111b, which are provided on the cell and connection regions 20 and 30, respectively, may be different from each other in terms of shape and size. For example, the first semiconductor pattern 111a may have a top surface shaped like a circle, while the second semiconductor pattern 111b may have a top surface shaped like an ellipse or a circle. In example embodiments, a short diameter of the elliptical top surface of the second semiconductor pattern 111b may range from 50% to 90% of a diameter of the circular top surface of the first semiconductor pattern 111a, where the short diameter is a dimension measured in a direction parallel to the minor axis of the ellipse. As an example, a diameter of the circular top surface of the dummy pillar is smaller than or equal to 50% of a diameter of the circular top surface of the vertical channel structure.

The buffer insulating layer 101 may be interposed between the substrate 100 and the ground selection gate electrode 202a, which is the lowermost one of the gate electrodes 202 positioned on the cell region 20, and between the substrate 100 and the ground selection pad 203a, which is the lowermost one of the pads 203 on the connection region 30. The buffer insulating layer 101 may be formed of or include an insulating material (e.g., silicon oxide, silicon nitride, or silicon oxynitride).

The capping insulating layer 105 may be provided on the connection region 30 to cover top or side surfaces of the interlayered insulating layers 102 and the pads 203.

The first upper interlayered insulating layer 107 may be provided on the cell region 20 to cover the uppermost one of the interlayered insulating layers 102 and enclose side surfaces of the vertical channel structure 110a and the common source structure 130. Further, the first upper interlayered insulating layer 107 may also be provided on the connection region 30 to cover the capping insulating layer 105 and enclose side surfaces of the dummy pillars 110b and the contact plug 150. For example, the vertical channel structures 110a and the common source structure 130 may be provided to penetrate the first upper interlayered insulating layer 107 in the vertical direction.

The second upper interlayered insulating layer 121 may be provided on the first upper interlayered insulating layer 107 to cover the vertical channel structures 110a and the dummy pillars 110b. On the cell region 20, the second upper interlayered insulating layer 121 may enclose a side surface of the common source structure 130.

The third upper interlayered insulating layer 135 may be provided on the second upper interlayered insulating layer 121 to cover the common source structure 130. The third upper interlayered insulating layer 135 may enclose a side surface of the connection plug 154 on the cell region 20 and may enclose a side surface of the contact plug 150 on the connection region 30.

The fourth upper interlayered insulating layer 152 may be provided on the third upper interlayered insulating layer 135 to cover the first metal line 151. The fourth upper interlayered insulating layer 152 may also enclose the side surfaces of the connection plugs 154 on the cell and connection regions 20 and 30.

The capping insulating layer 105 and the first to fourth upper interlayered insulating layers 107, 121, 135, and 152 may be formed of or include high-density plasma (HDP) oxide, tetra ethyl ortho silicate (TEOS), plasma-enhanced TEOS (PE-TEOS), O$_3$-TEOS, undoped silicate glass (USG), phosphosilicate glass (PSG), borosilicate glass (BSG), borophosphosilicate glass (BPSG), fluoride silicate glass (FSG), spin on glass (SOG), tonen SilaZene (TOSZ), or any combination thereof.

The bit line 160 may be formed on the fourth upper interlayered insulating layer 152. The bit line 160 may be formed of or include a metallic material (e.g., tungsten (W)). The bit line 160 may extend parallel to a second direction across or orthogonal to the first direction.

The connection plug 154 may be formed between the bit line 160 and the vertical channel structures 110a. The connection plug 154 may connect the bit line 160 electrically with the vertical channel structures 110a. The connection plug 154 may be formed of or include a conductive material (e.g., doped silicon, metal silicides, or metals).

Referring again to FIGS. 2 and 3, the first metal lines 151 may be provided on the third upper interlayered insulating layer 135 of the connection region 30 in such a way that, in a plan view, each of them has at least one portion overlapped with the ground selection plugs 150a or the cell plugs 150b. As an example, each of the first metal lines 151 may be electrically connected to a portion of the cell pads 203b or a portion of the ground selection pads 203a that are arranged in the direction parallel to, for example, the bit line 160. In other words, the first metal lines 151 may extend parallel to a direction across or orthogonal to the specific direction. The second metal lines 155 may be provided on the fourth upper interlayered insulating layer 152. The second metal lines 155 may be electrically connected to the string selection pads 203c via the connection plugs 154. The second metal line 155 may extend parallel to the first direction. According to example embodiments of inventive concepts, by electrically insulating the dummy pillars 110b from the second semiconductor pattern 111b or the substrate 100, it is possible to limit (and/or prevent) a leakage current, which may be caused by process failures, such as a dielectric breakdown and physical defects, from occurring between the contact plugs 150 and the dummy pillars 110b. Accordingly, the dummy pillars 110b of the connection region 30 can be limited (and/or prevented) from being used as a pathway for a leakage current, and thus, it is possible to realize the three-dimensional semiconductor device with good electric characteristics.

Hereinafter, the vertical channel structures 110a and the dummy pillars 110b of FIG. 3 will be described with reference to enlarged views of FIGS. 4A through 4C, which illustrate regions B1, B2, and B3 of FIG. 3, respectively.

Figure 4A:
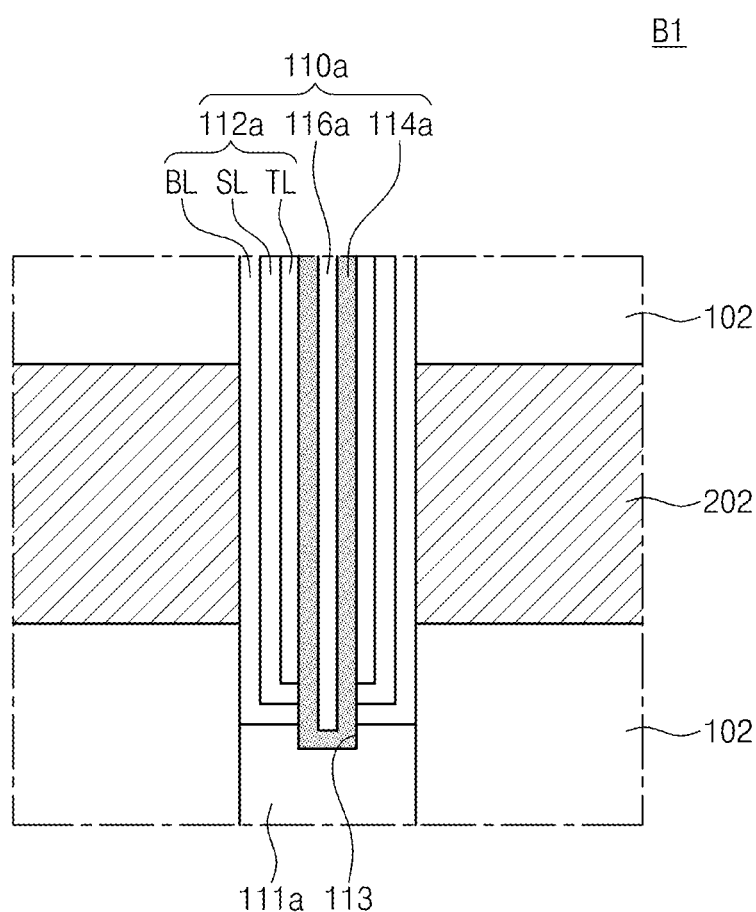
FIGS. 4A through 4C are enlarged views illustrating regions B1, B2, and B3, respectively, of FIG. 3.

Referring to FIG. 4A, each of the vertical channel structures 110a may include a first gate dielectric pattern 112a, a first vertical channel pattern 114a, and an insulating filling pattern 116a, which extend upward from the substrate 100. The first gate dielectric pattern 112a may include a tunnel insulating layer TL, a charge storing layer SL, and a charge blocking layer BL.

The tunnel insulating layer TL, the charge storing layer SL, and the charge blocking layer BL may be interposed between the gate electrodes 202 and the first vertical channel patterns 114a. The charge blocking layer BL may be adjacent to the cell gate electrodes 202b, and the tunnel insulating layer TL may be adjacent to the first vertical channel pattern 114a. The charge storing layer SL may be disposed between the charge blocking layer BL and the tunnel insulating layer TL. The tunnel insulating layer TL may include at least one of a silicon oxide layer, a silicon nitride layer, or a silicon oxynitride layer. The charge storing layer SL may include a silicon nitride layer with trap sites or an insulating layer with conductive nano dots. The charge blocking layer BL may include a high-k dielectric layer, whose dielectric constant is higher than that of the tunnel insulating layer TL. The charge blocking layer BL, the charge storing layer SL, and the tunnel insulating layer TL may vertically extend to cover a sidewall of the first vertical channel pattern 114a. In addition, the first vertical channel pattern 114a may have a macaroni or hollow pipe shape. The first vertical channel pattern 114a may have a bottom surface that is in direct contact with a top surface of the first semiconductor pattern 111a. Accordingly, the first vertical channel pattern 114a may be electrically connected to the substrate 100 via the first semiconductor pattern 111a. The vertical channel pattern 114a may include a semiconductor material (e.g., poly silicon). The top surface of the first semiconductor pattern 111a may be provided to have a recessed dent 113 that is in direct contact with the first vertical channel pattern 114a. The insulating filling pattern 116a may fill a gap region delimited by the first vertical channel pattern 114a. The insulating filling pattern 116a may be formed of or include at least one insulating material (e.g., silicon oxide).

Figure 4B:
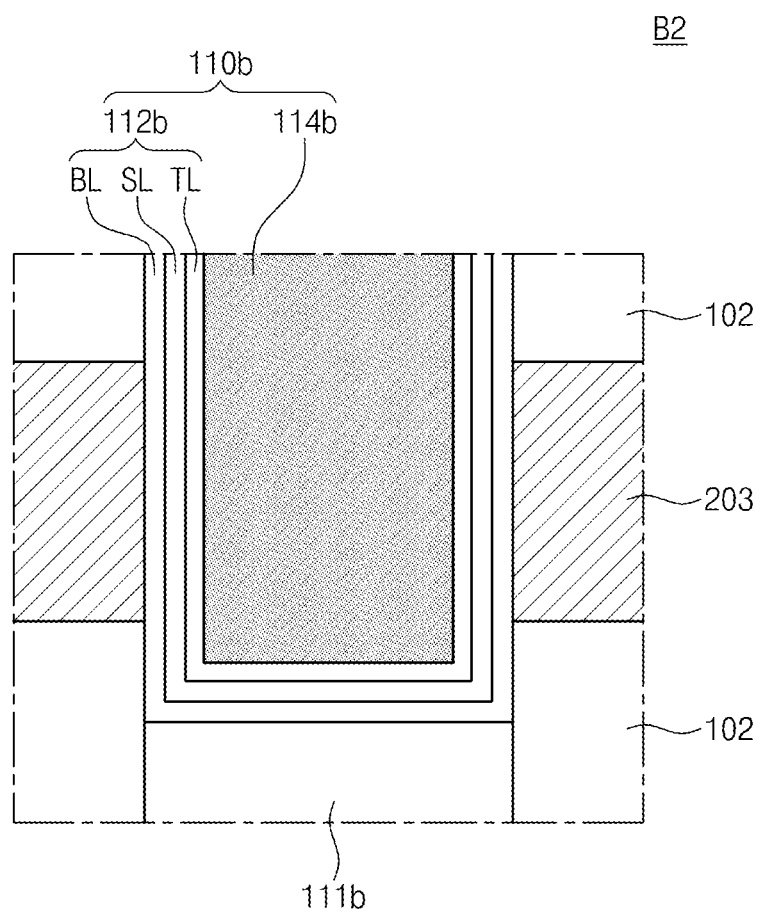
Figure 4C:
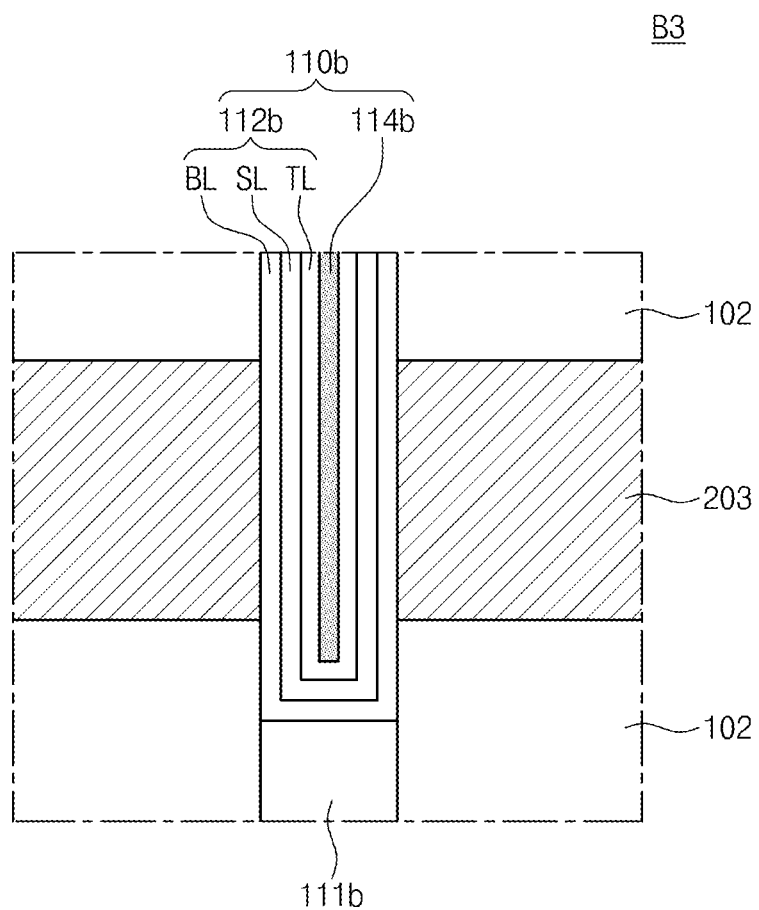

Referring to FIGS. 4B and 4C, the dummy pillars 110b may have a different structure from the vertical channel structures 110a. In example embodiments, each of the dummy pillars 110b may include the second gate dielectric pattern 112b and the second vertical channel pattern 114b, which extend upward from the substrate 100. The second gate dielectric pattern 112b may include the charge blocking layer BL, the charge storing layer SL, and the tunnel insulating layer TL, similar to the first gate dielectric pattern 112a. The second gate dielectric pattern 112b may be provided to have a 'U'-shaped section and cover side and bottom surfaces of the second vertical channel pattern 114b. The second vertical channel pattern 114b may be a pillar-shaped structure that is different from the first vertical channel pattern 114a and may be provided to fill an internal space defined by the second gate dielectric pattern 112b. The second vertical channel pattern 114b may be separated from the second semiconductor pattern 111b by the second gate dielectric pattern 112b. Accordingly, the second vertical channel pattern 114b may be electrically insulated from the second semiconductor pattern 111b. Further, the second vertical channel pattern 114b may also be electrically insulated from the substrate 100. The second semiconductor pattern 111b on the connection region 30 may have a substantially flat top surface.

Other examples of the dummy pillars will be described with reference to enlarged views of FIGS. 5A and 5B, which illustrate the regions B2 and B3 of FIG. 3, respectively.

Figure 5A:
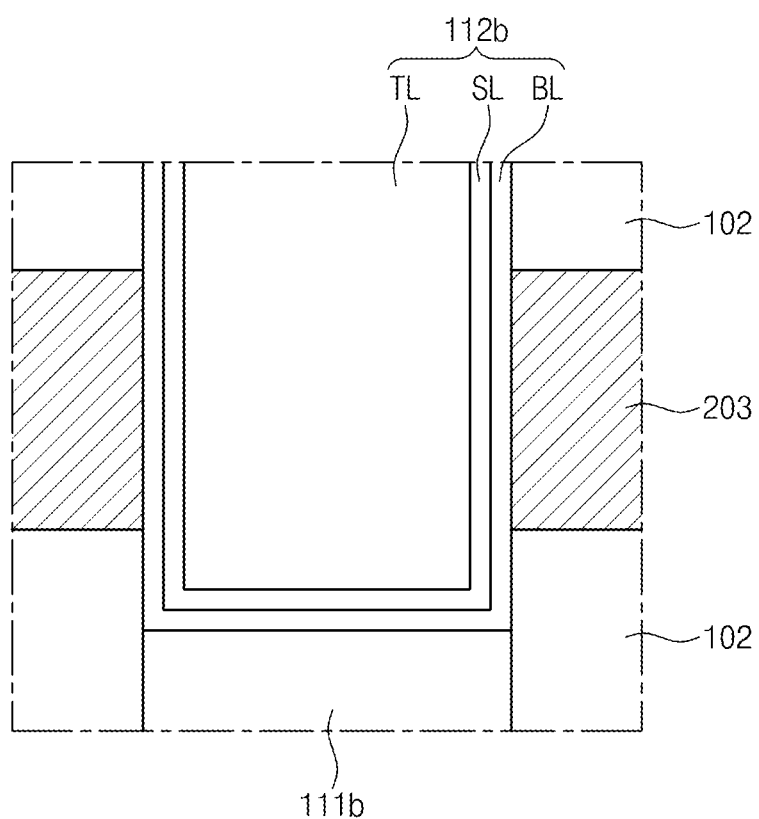
FIGS. 5A and 5B are enlarged views illustrating the regions B2 and B3, respectively, of FIG. 3.
Figure 5B:
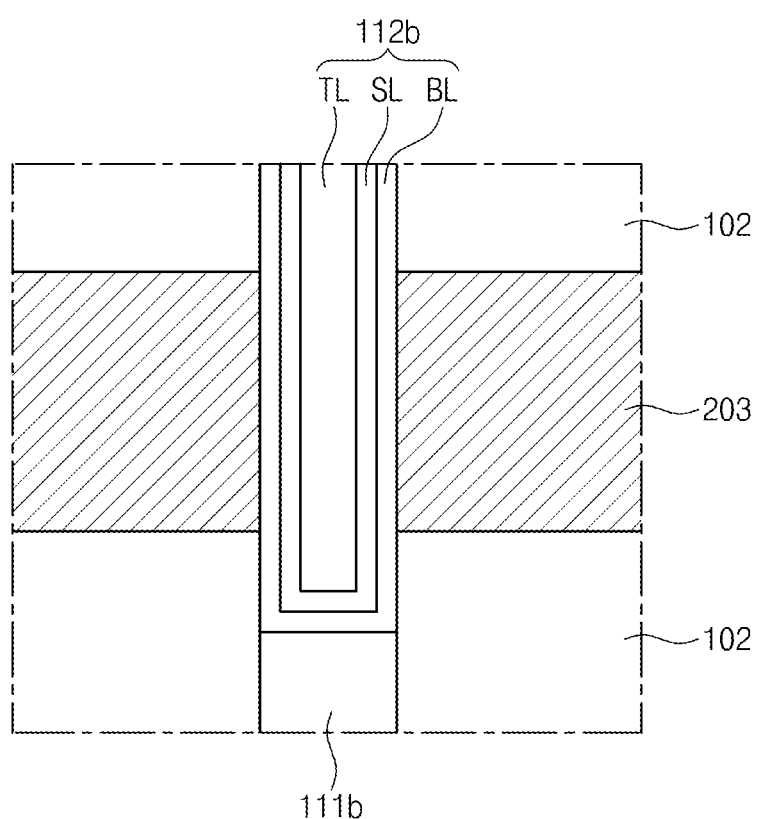

Referring to FIGS. 5A and 5B, each of the dummy pillars 110b may be configured to include only the second gate dielectric pattern 112b without the second vertical channel pattern 114b. Accordingly, it is possible to limit (and/or prevent) the dummy pillars 110b from serving as a pathway of a leakage current.

Figure 15A:
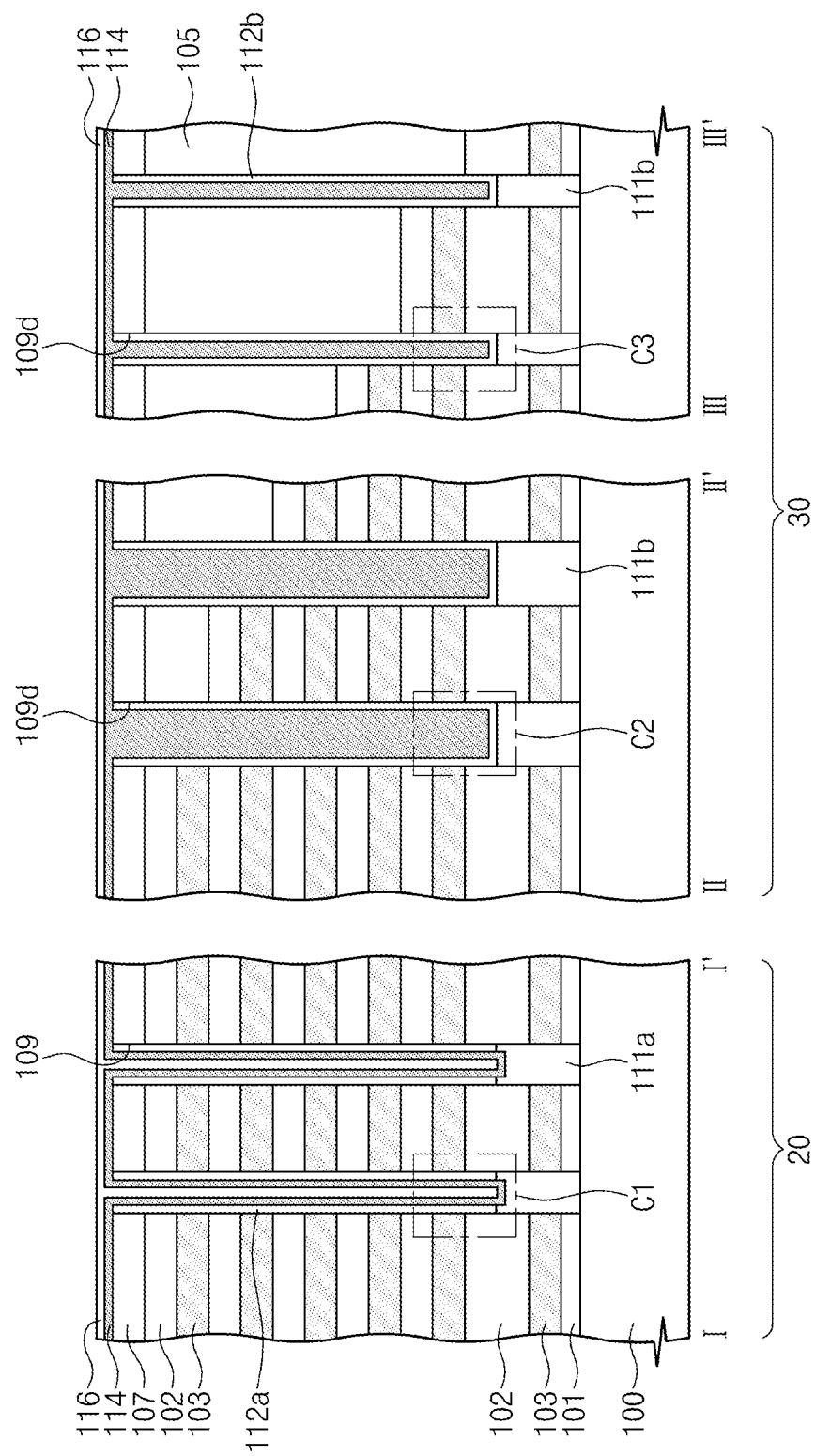
Figure 15B:
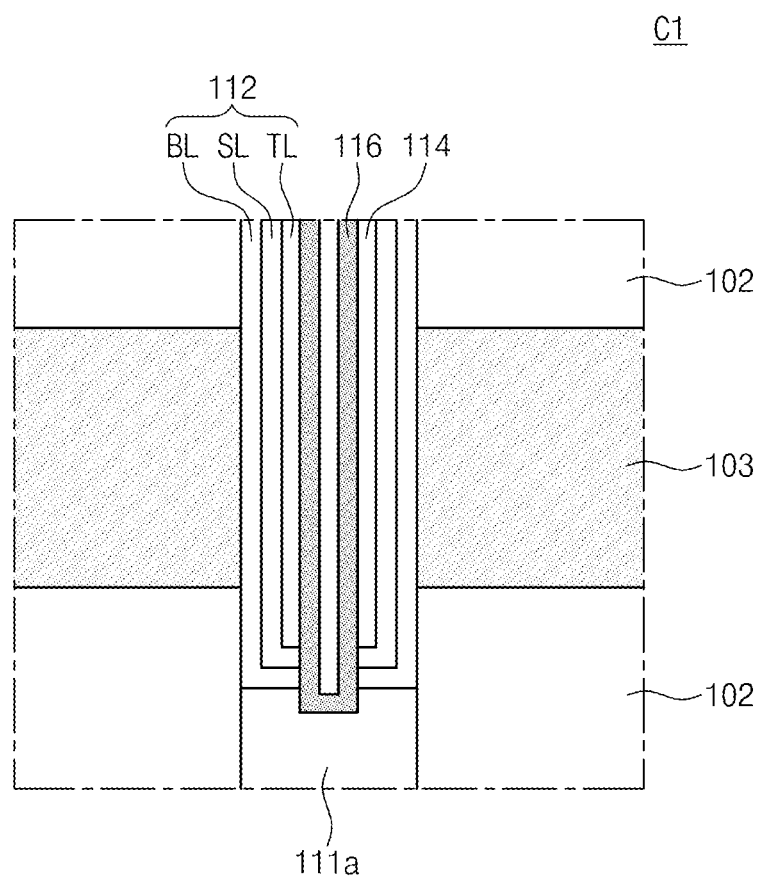
FIGS. 15B through 15D are enlarged views illustrating regions C1, C2, and C3, respectively, of FIG. 15A.
Figure 15C:
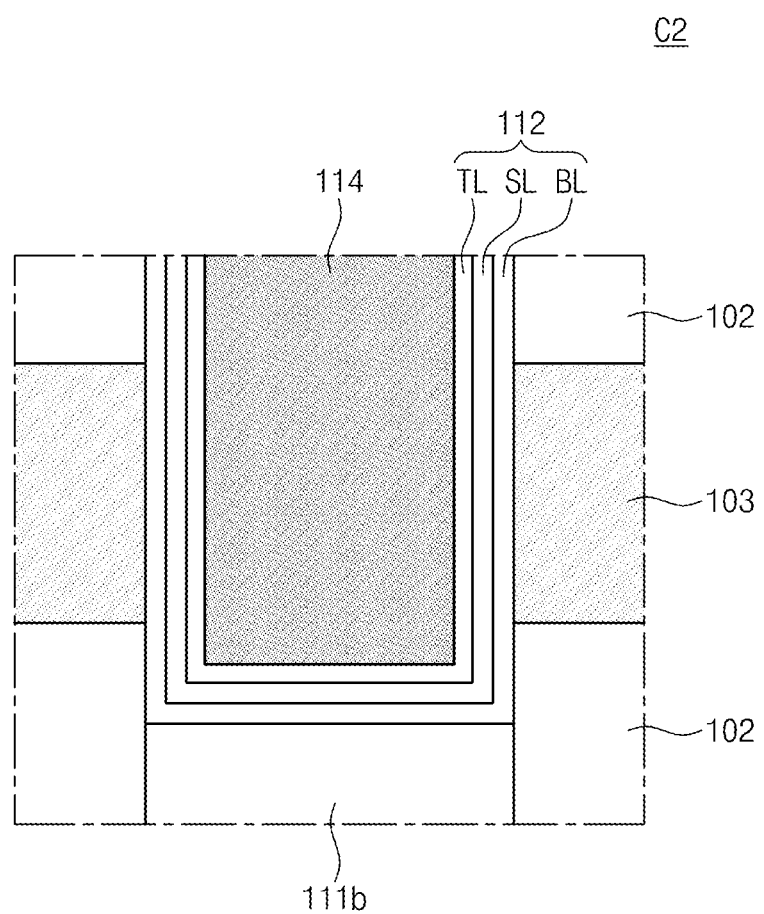
Figure 15D:
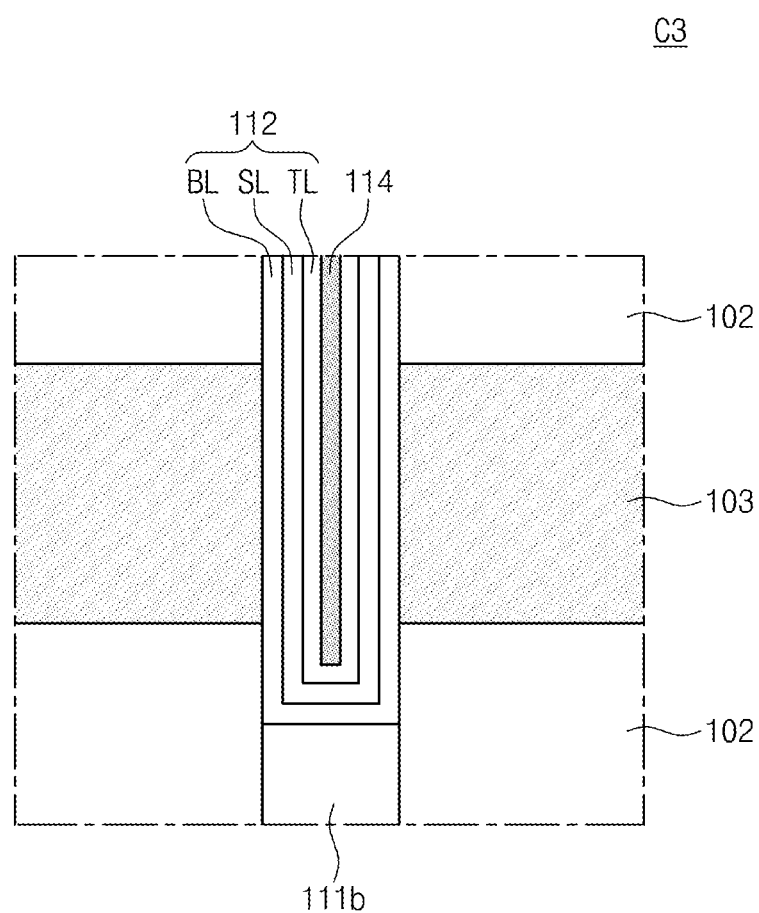
Figure 16A:
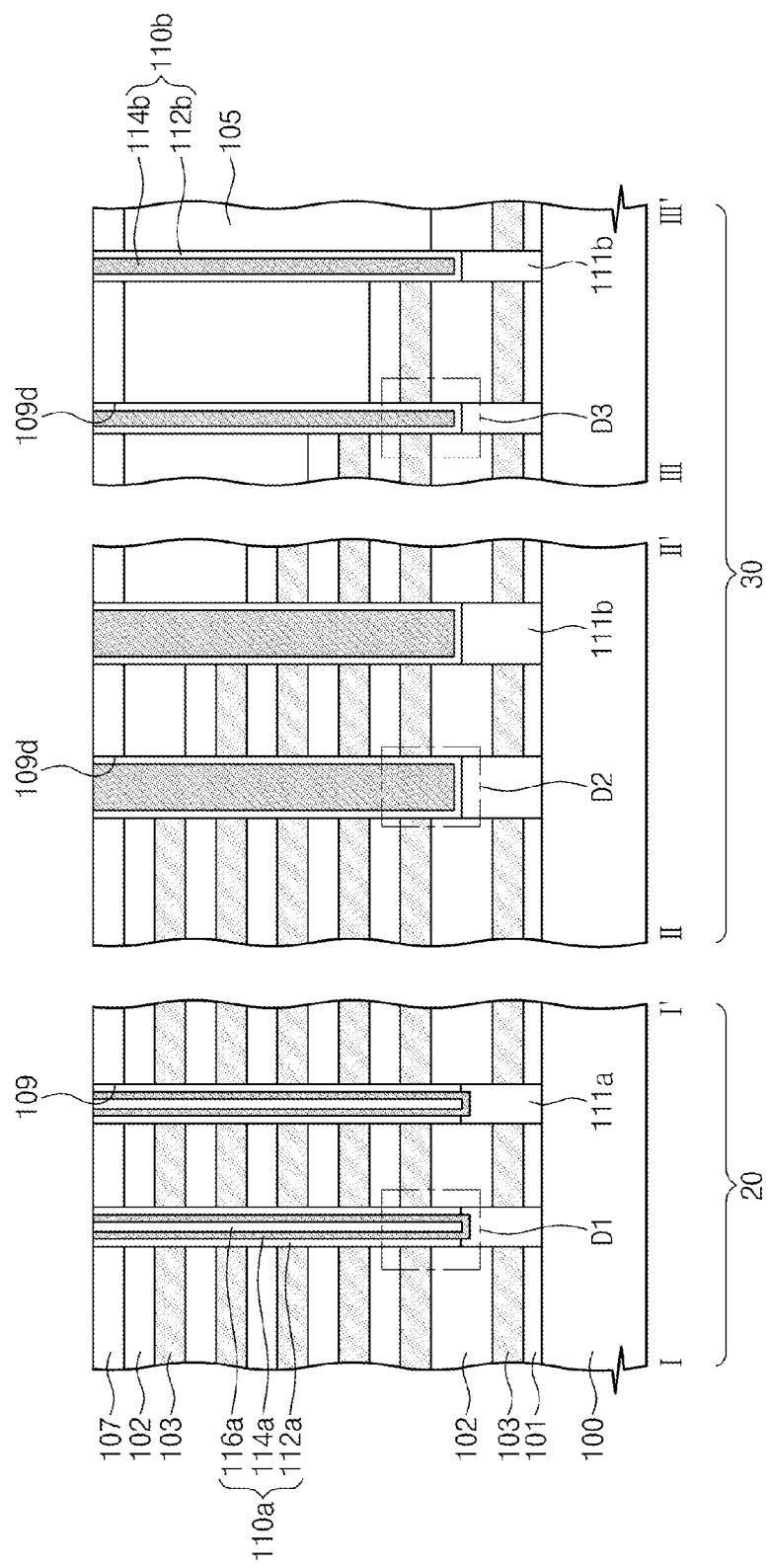
Figure 16B:
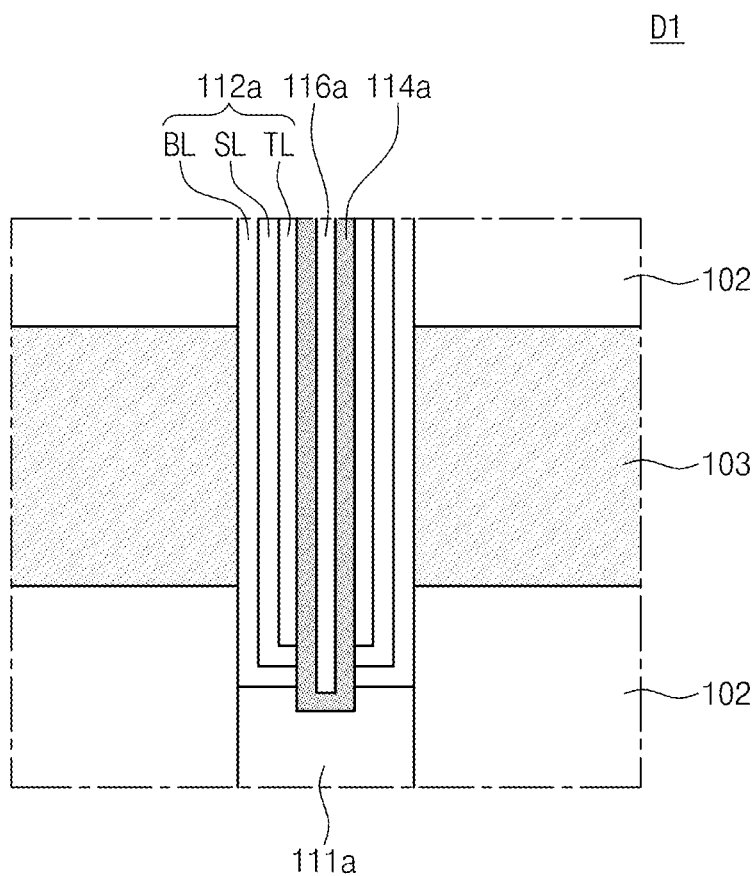
FIGS. 16B through 16D are enlarged views illustrating regions D1, D2, and D3, respectively, of FIG. 16A.
Figure 16C:
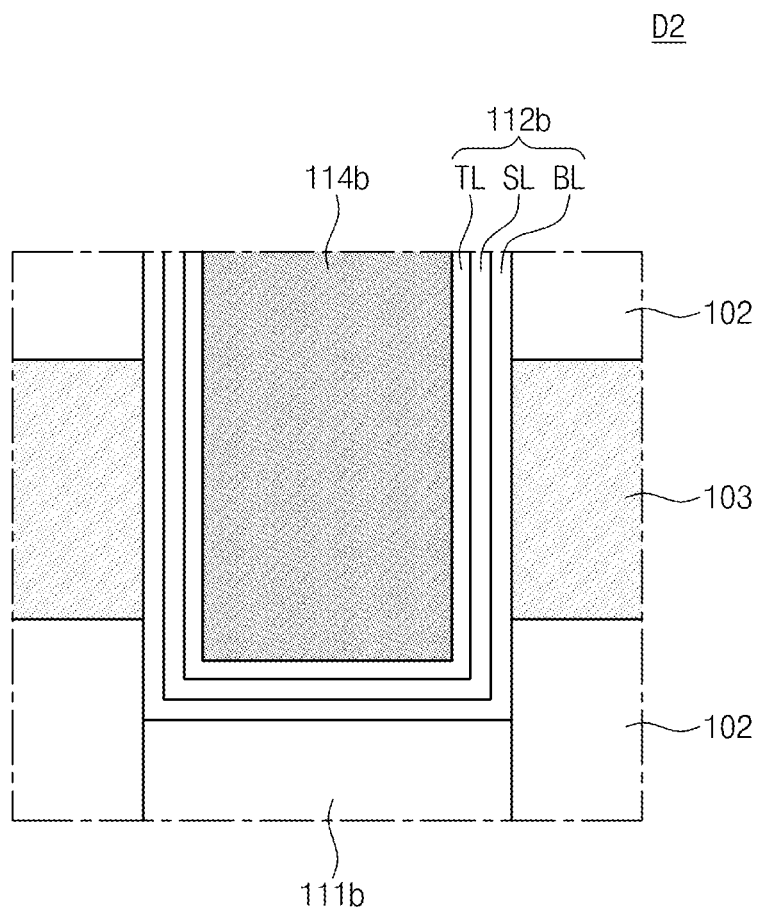
Figure 16D:
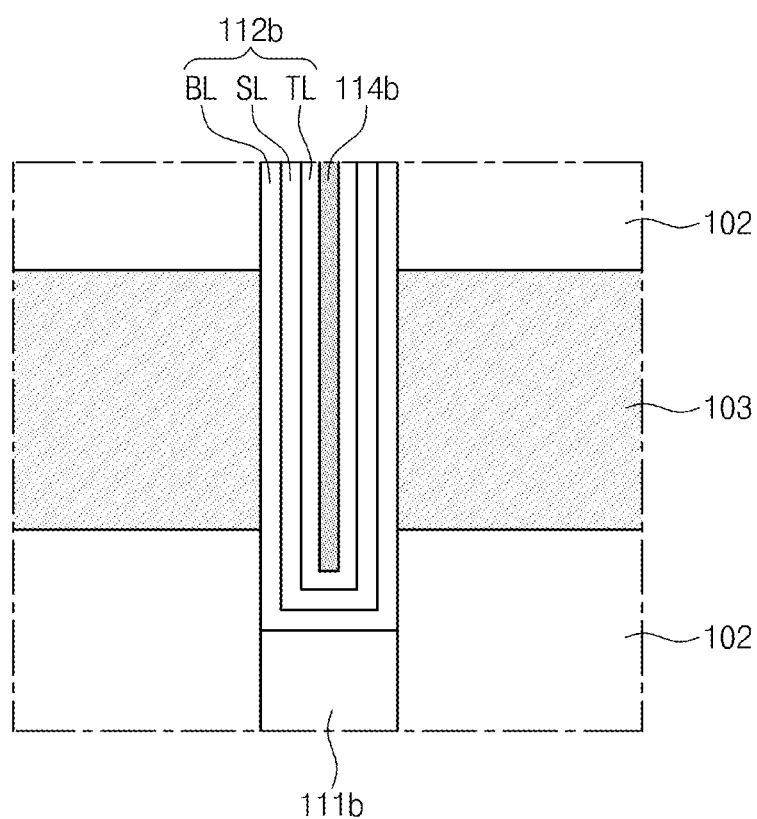

FIGS. 6 through 14, 15A, 16A, and 17 through 24 are sectional views illustrating a method of fabricating a three-dimensional semiconductor device according to example embodiments of inventive concepts. Here, FIGS. 6 through 14, 15A, 16A, and 17 through 24 are sectional views taken along lines I-I', II-II', and III-III' of FIG. 2. FIGS. 15B through 15D are enlarged views illustrating regions C1, C2, and C3, respectively, of FIG. 15A. FIGS. 16B through 16D are enlarged views illustrating regions D1, D2, and D3, respectively, of FIG. 16A.

Figure 6:
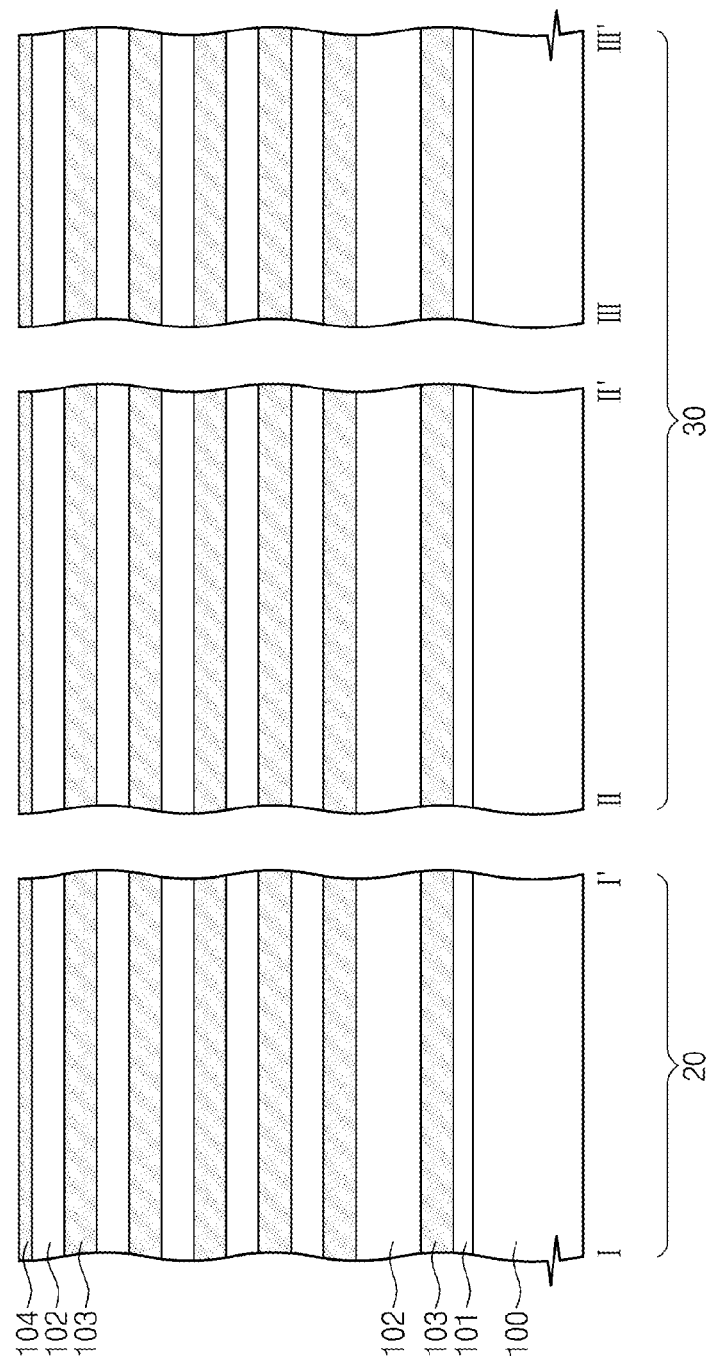
FIGS. 6 through 14, 15A, 16A, and 17 through 24 are sectional views taken along lines I-I', II-II', and III-III' of FIG. 2 to illustrate a method of fabricating a three-dimensional semiconductor device according to example embodiments of inventive concepts.

Referring to FIG. 6, the buffer insulating layer 101 may be formed on the substrate 100 with the cell region 20 and the connection region 30. The substrate 100 may be a semiconductor wafer such as a silicon wafer or a silicon-germanium wafer with an epitaxial layer. The substrate 100 may be a semiconductor on insulator wafer, such as a silicon-on-insulator (SOI) wafer.

Sacrificial layers 103 and interlayered insulating layers 102 may be alternatingly and repeatedly formed on the buffer insulating layer 101. A polishing-resistant layer 104 may be provided on the uppermost one of the interlayered insulating layers 102. The buffer insulating layer 101 may be formed to be thinner than each of the interlayered insulating layers 102. The interlayered insulating layers 102 may be formed to have at least two different thicknesses. For example, the lowermost one of the interlayered insulating layers 102 may be formed to be thicker than the others of the interlayered insulating layers 102. The buffer insulating layer 101 and the interlayered insulating layers 102 may be formed of or include an insulating material (e.g., silicon oxide).

The sacrificial layers 103 and the polishing-resistant layer 104 may be formed of or include a material having an etch selectivity with respect to the buffer insulating layer 101 and the interlayered insulating layers 102. For example, the sacrificial layers 103 and polishing-resistant layer 104 may be formed of or include an insulating material (e.g., silicon nitride).

Figure 7:
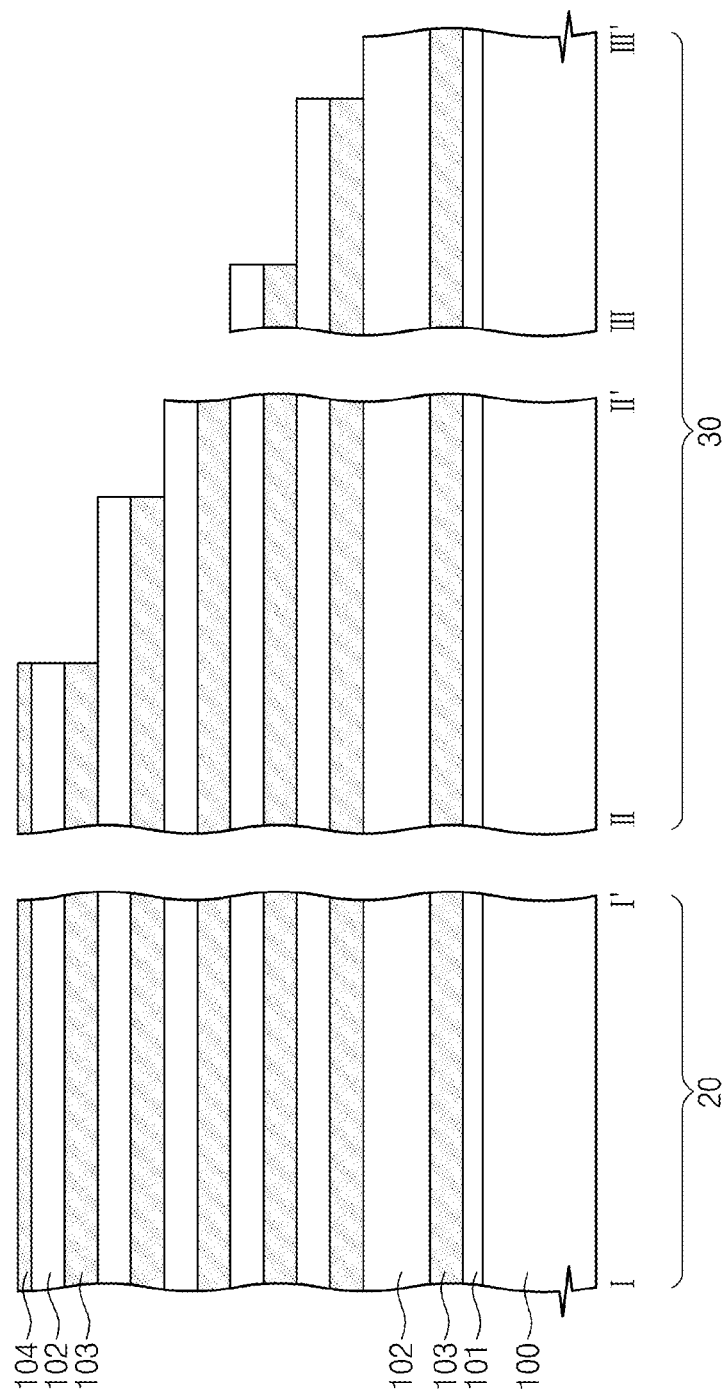

Referring to FIG. 7, the interlayered insulating layers 102, the sacrificial layers 103, and the polishing-resistant layer 104 on the connection region 30 may be patterned to form a staircase structure. The formation of the staircase structure may include at least two distinct steps of patterning the interlayered insulating layers 102, the sacrificial layers 103, and the polishing-resistant layer 104. For example, on the connection region 30, the interlayered insulating layers 102 and the sacrificial layers 103 may be formed to have a difference in horizontal length depending on a vertical position thereof. In example embodiments, the horizontal lengths of the interlayered insulating layers 102 and the sacrificial layers 103 may decrease in a direction away from the substrate 100. For example, the lowermost ones of the interlayered insulating layers 102 and the sacrificial layers 103 may be formed to have the longest horizontal lengths, and the uppermost ones of the interlayered insulating layers 102 and the sacrificial layers 103 and the polishing-resistant layer 104 may be formed to have the shortest horizontal lengths.

Figure 8:
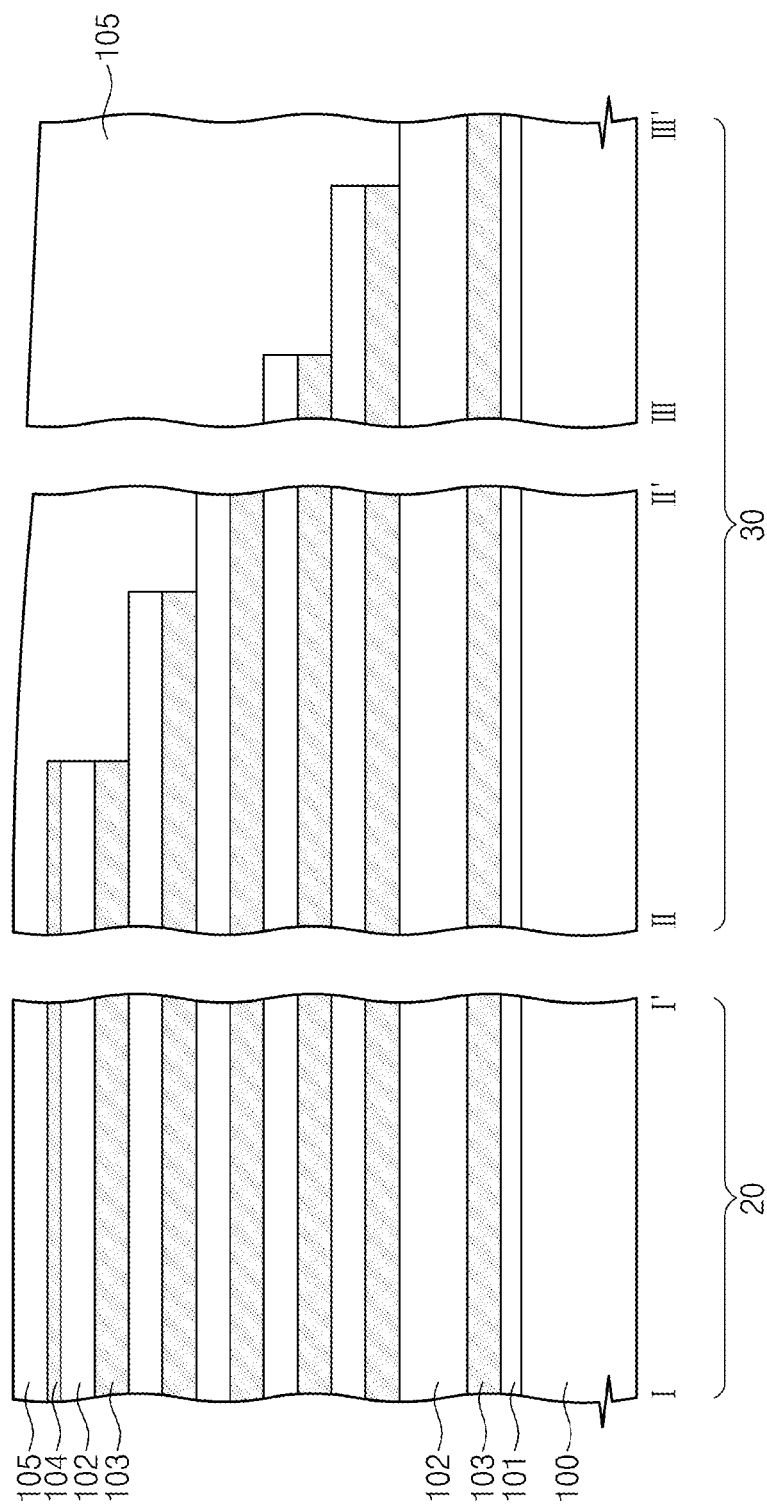

Referring to FIG. 8, the capping insulating layer 105 may be formed on the whole top surface of the substrate 100 provided with the staircase structure. The capping insulating layer 105 may be formed to be thick enough to reduce a difference in thickness between the cell and connection regions 20 and 30 caused by the presence of the staircase structure. The capping insulating layer 105 may include a material having an etch selectivity with respect to the polishing-resistant layer 104. For example, the capping insulating layer 105 may be formed of or include high-density plasma (HDP) oxide, tetra ethyl ortho silicate (TEOS), plasma-enhanced TEOS (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin on glass (SOG), tonen SilaZene (TOSZ), or any combination thereof.

Figure 9:
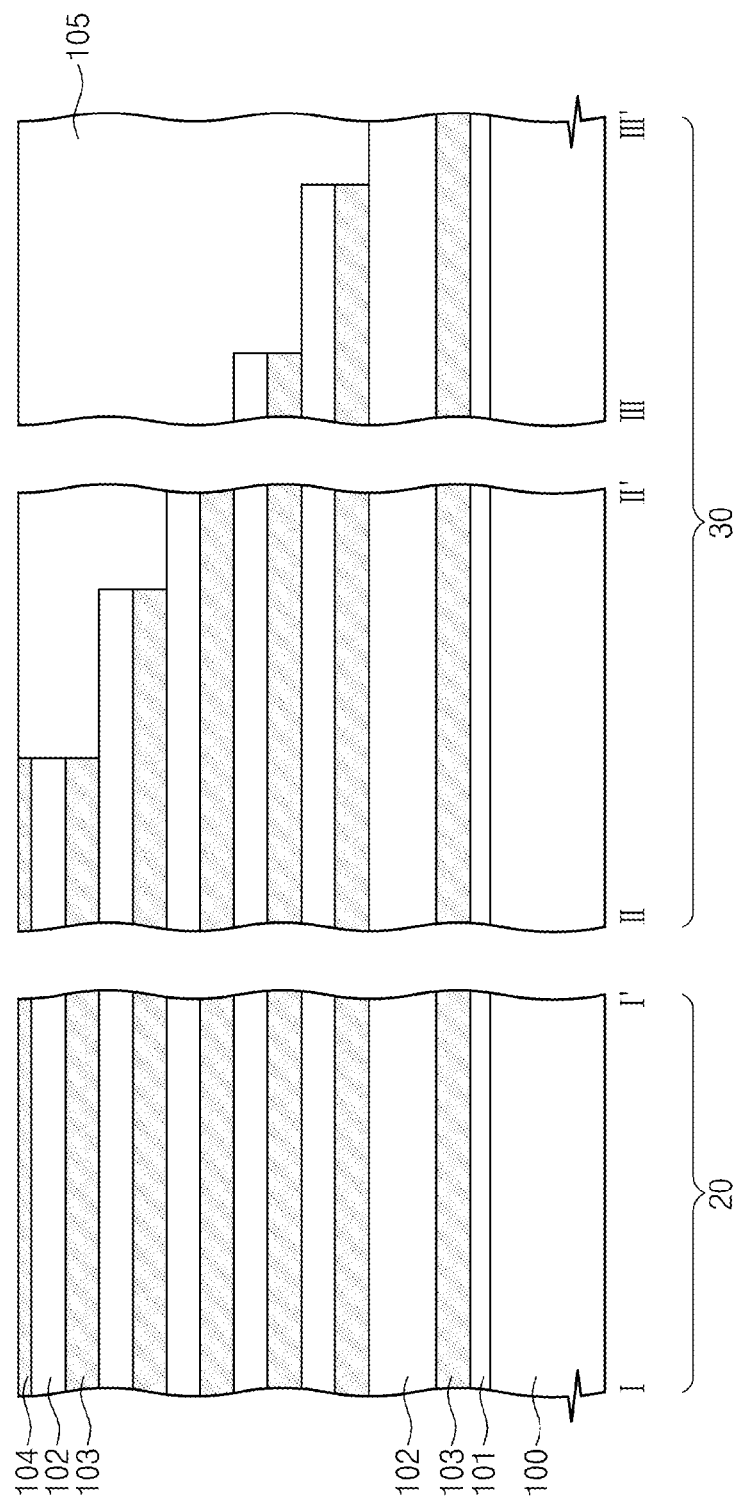

Referring to FIG. 9, a planarization process may be performed on the capping insulating layer 105. The planarization process may be performed using a chemical mechanical polishing (CMP) process. The polishing-resistant layer 104 may be used as a layer for determining an end point of the planarization process. For example, a top surface of the polishing-resistant layer 104 may be partially or wholly exposed after the planarization process.

Figure 10:
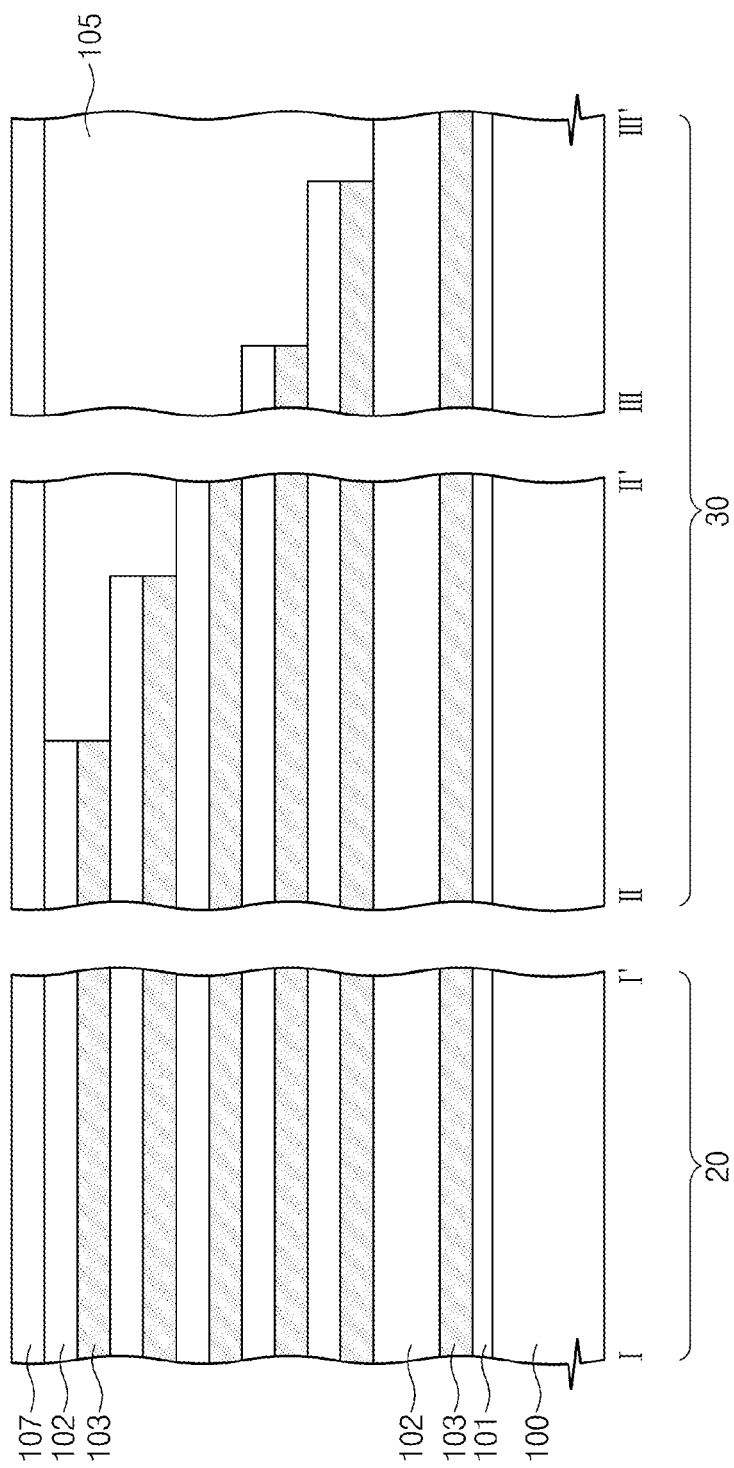

Referring to FIG. 10, the polishing-resistant layer 104 may be removed, and then, the first upper interlayered insulating layer 107 may be formed on the resulting structure. The polishing-resistant layer 104 may be removed using a wet etching process. For example, the removal of the polishing-resistant layer 104 may be performed using an etching solution containing phosphoric acid. As a result of the removal of the polishing-resistant layer 104, the uppermost one of the interlayered insulating layers 102 may be exposed. In other words, the capping insulating layer 105 may be removed from the whole of the cell region 20, but a remaining portion of the capping insulating layer 105 may remain on the connection region 30. The first upper interlayered insulating layer 107 may be formed to cover not only the interlayered insulating layers 102 but also the capping insulating layer 105. The first upper interlayered insulating layer 107 may be formed of or include the same material as the capping insulating layer 105.

Figure 11:
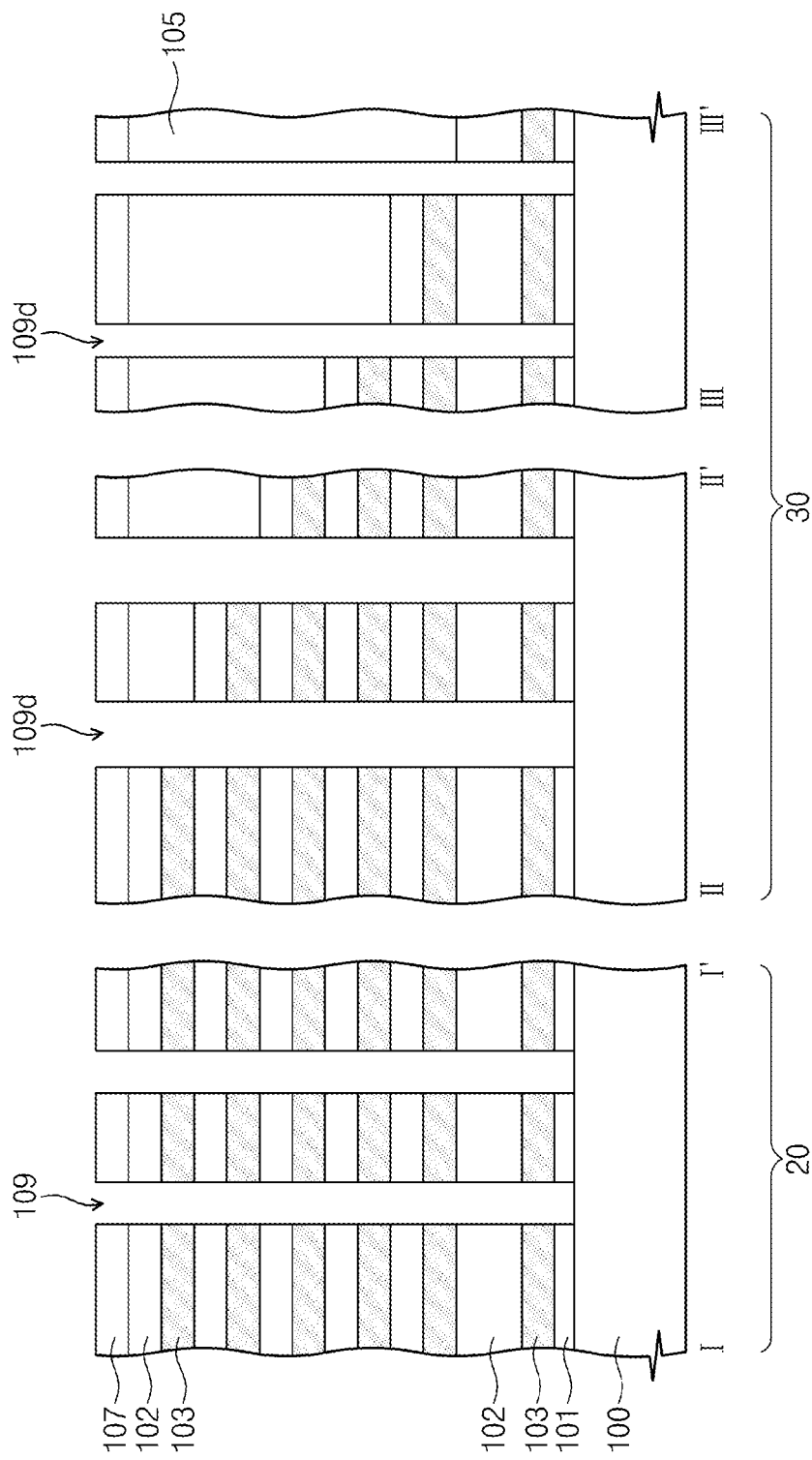

Referring to FIG. 11, channel holes 109 may be formed on the cell region 20 and dummy holes 109d may be formed on the connection region 30. The formation of the channel holes 109 may include forming a mask pattern (not shown) on the first upper interlayered insulating layer 107 and then continuously and anisotropically etching the first upper interlayered insulating layer 107, the interlayered insulating layers 102, the sacrificial layers 103, and the buffer insulating layer 101 using the mask pattern as an etch mask, until the top surface of the substrate 100 is exposed. The formation of the dummy holes 109d may include continuously and anisotropically etching the first upper interlayered insulating layer 107, the capping insulating layer 105, the interlayered insulating layers 102, the sacrificial layers 103, and the buffer insulating layer 101 using the mask pattern (not shown) as an etch mask, until the top surface of the substrate 100 is exposed. When viewed in a plan view, each of the channel holes 109 may be formed to have a circular shape, and each of the dummy holes 109d may be formed to have an elliptical or a circular shape.

The dummy holes 109d may have a short diameter that is smaller than a diameter of each of the channel holes 109, where the short diameter is a dimension measured in a direction parallel to the minor axis of the elliptical shape. For some example, the short diameter of the dummy holes 109d may range from 50% to 90% of the diameter of the channel holes 109. For example, see FIG. 2. For some example, a diameter of the circular top surface of the dummy pillar is smaller than or equal to 50% of a diameter of the circular top surface of the vertical channel structure.

Figure 12:
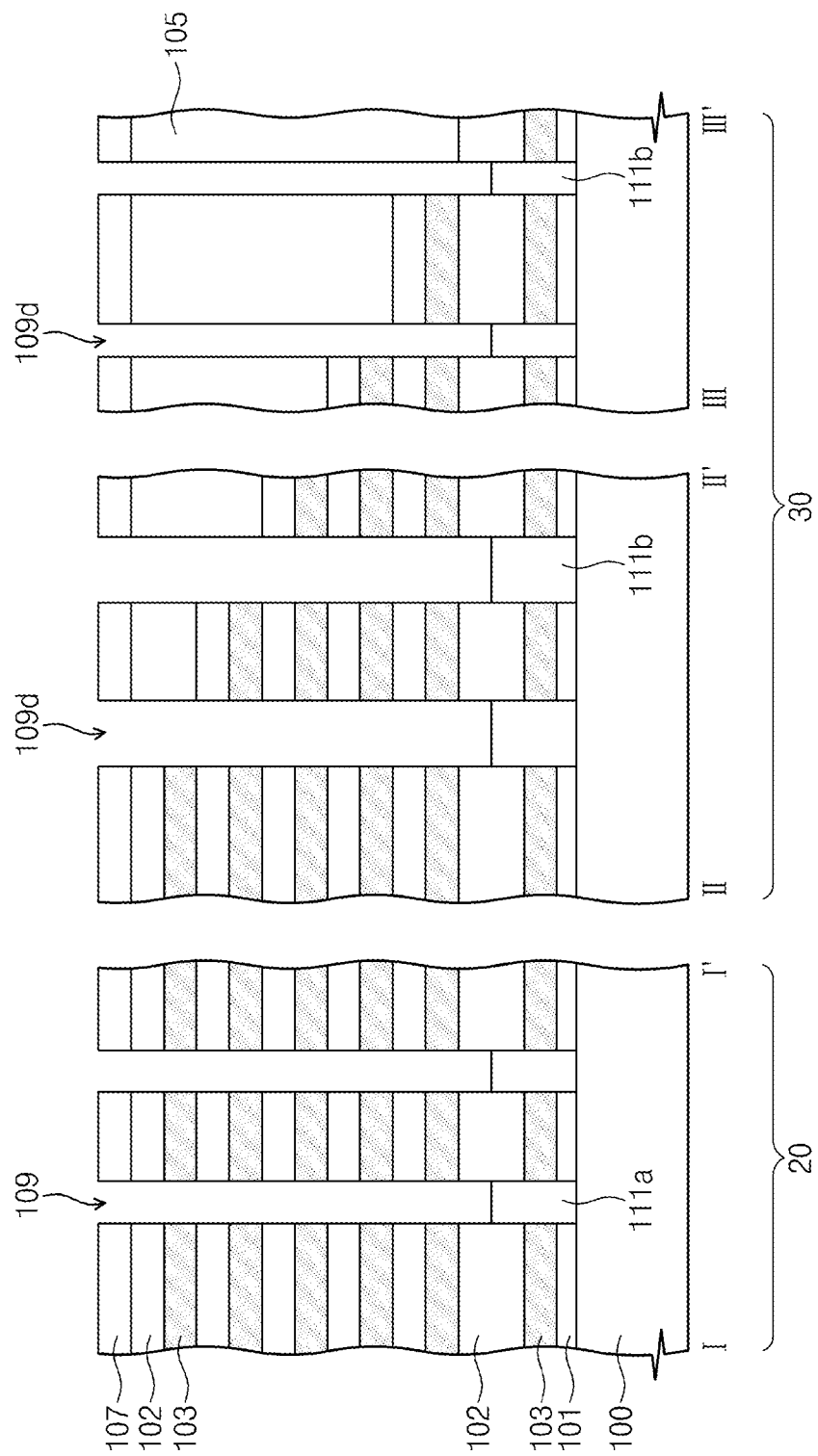

Referring to FIG. 12, the first and second semiconductor patterns 111a and 111b may be formed in the channel and dummy holes 109 and 109d, respectively. For example, the first and second semiconductor patterns 111a and 111b may be formed by a selective epitaxial growth (SEG) process, in which the top surface of the substrate 100 exposed by the channel and dummy holes 109 and 109d is used as a seed layer. The first and second semiconductor patterns 111a and 111b may be formed to partially fill lower portions of the channel and dummy holes 109 and 109d, respectively. The semiconductor patterns 111a and 111b may be formed of or include single crystalline silicon or single crystalline silicon-germanium and, in some cases, may be doped with impurities or dopants. Each of the semiconductor patterns 111a and 111b may be formed in such a way that its top surface is positioned at a higher level than that of the lowermost one of the sacrificial layers 103.

Figure 13:
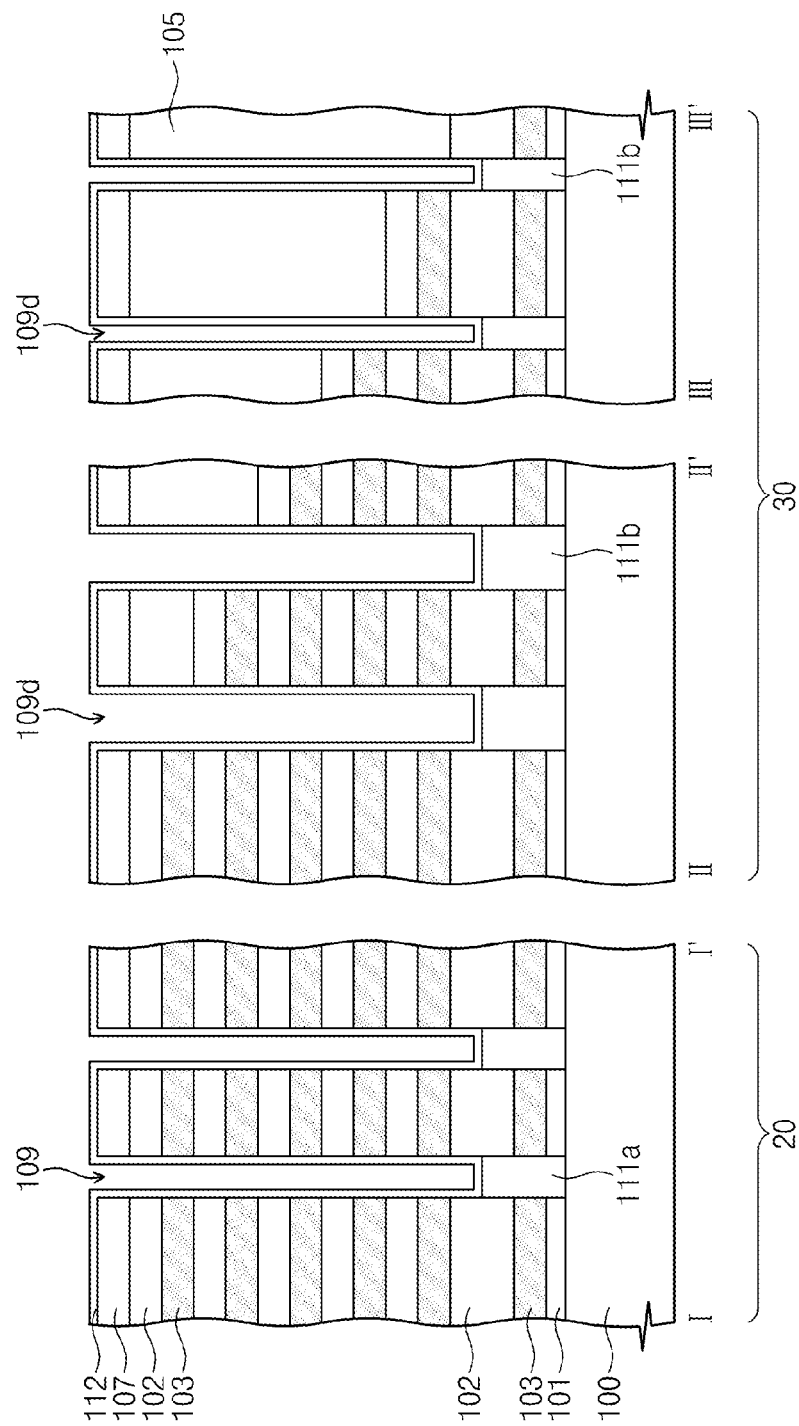

Referring to FIG. 13, a gate dielectric layer 112 may be formed to cover the top surface of the first upper interlayered insulating layer 107, side surfaces of the channel and dummy holes 109 and 109d, and top surfaces of the semiconductor patterns 111a and 111b. The gate dielectric layer 112, illustrated as a single layer in FIG. 13, may include the charge blocking layer BL, the charge storing layer SL, and the tunnel insulating layer TL. In example embodiments, the charge blocking layer BL, the charge storing layer SL, and the tunnel insulating layer TL may be formed to sequentially cover the sidewall of each of the channel and dummy holes 109 and 109d. The charge blocking layer BL may be formed of or include a silicon oxide layer or a silicon oxynitride layer. The charge storing layer SL may be formed of or include a silicon nitride layer. The tunnel insulating layer TL may be formed of or include a silicon oxide layer or a silicon oxynitride layer.

Although not illustrated, a lithography mask may be formed on top of the first upper interlayered insulating layer 107 before forming the gate dielectric layer 112. The mask may cover the cell region 20 and expose the connection region 30. Impurities (e.g., N, Ar) may be implanted through the lithography mask to reduce a crystallinity of the top surface of the second semiconductor patterns 111b. The lithography mask may be subsequently removed before forming the gate dielectric layer 112. However, example embodiments are not limited thereto and the lithography mask and impurity implantation into the second semiconductor patterns 111b may be omitted.

Figure 14:
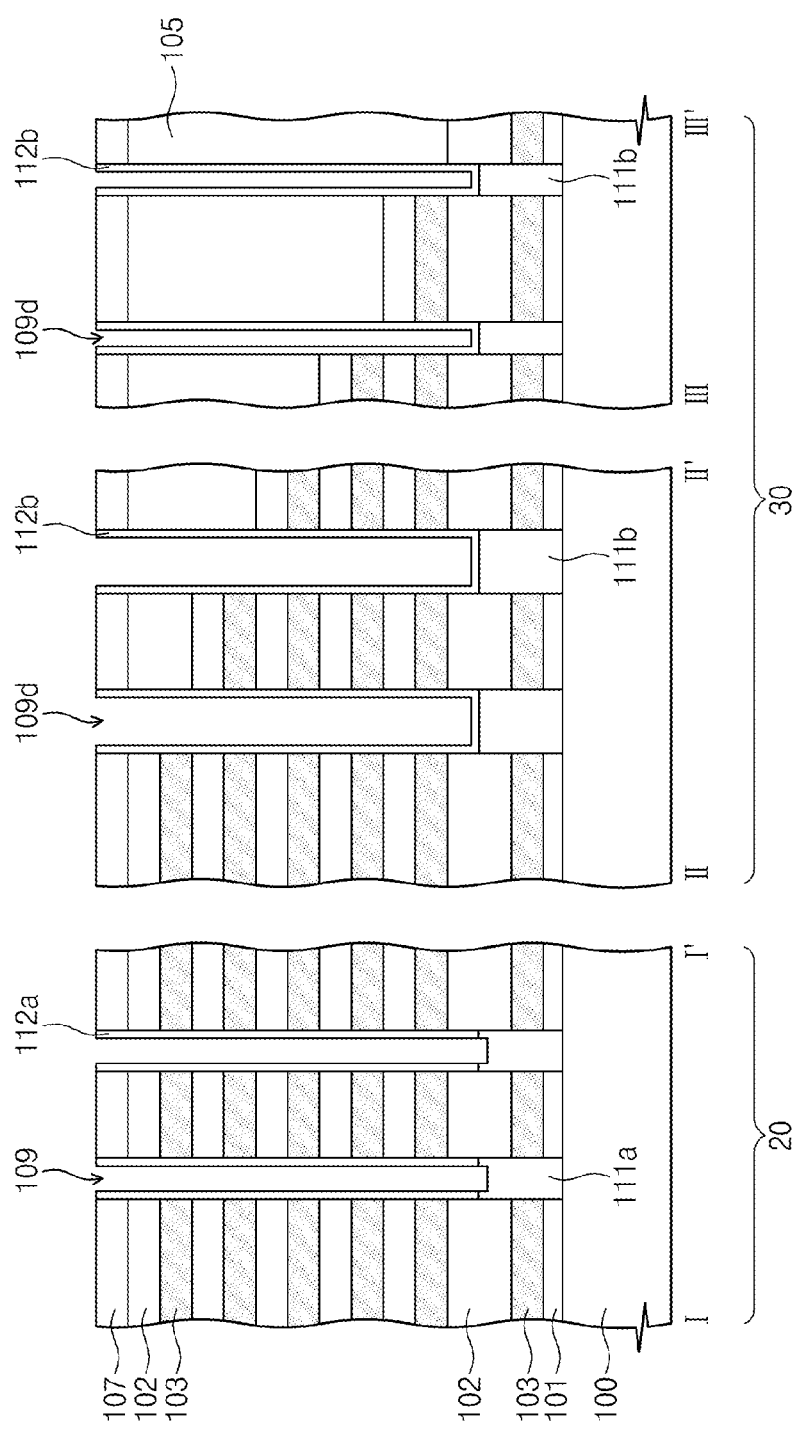

Referring to FIG. 14, the gate dielectric layer 112 may be anisotropically etched to open not only the top surface of the first upper interlayered insulating layer 107 but also the top surface of the first semiconductor pattern 111a provided in each of the channel holes 109. In other words, the first gate dielectric pattern 112a shaped like a spacer may be formed on the sidewall of each of the channel holes 109, as a result of the anisotropic etching process. The exposed top surfaces of the first semiconductor patterns 111a in the channel holes 109 may be over-etched during the anisotropic etching process to form a recessed structure. Further, as a result of the anisotropic etching process, the second gate dielectric pattern 112b may be formed to have a 'U'-shaped cross section in the dummy holes 109d. The second gate dielectric pattern 112b may cover the sidewalls of the dummy holes 109d and the top surface of the second semiconductor pattern 111b formed in the dummy holes 109d. Here, the top surface of the second semiconductor pattern 111b may be covered with the second gate dielectric pattern 112b and may not be exposed. In other words, the top surface of the first semiconductor pattern 111a on the cell region 20 may have a recessed dent, and the top surface of the second semiconductor pattern 111b on the connection region 30 may be flat.

As described above, the short diameter of the elliptical dummy holes 109d may range from 50% to 90% of the diameter of the channel holes 109. That is, a volume or area of each dummy hole 109d may be smaller than that of the channel holes 109. This may limit the supply of an etching gas into the dummy holes 109d and exhausting an etch residue from the dummy holes 109d. In other words, the etching process on the gate dielectric layer 112 in the dummy holes 109d may be limited and/or reduced compared the etching process on the gate dielectric layer 112 in the channel holes 109. As a result, the gate dielectric layer 112 in the dummy holes 109d may not be etched to remain on the second semiconductor pattern 111b.

Referring to FIGS. 15A through 15D, a channel layer 114 and an insulating filling layer 116 may be sequentially formed in the channel holes 109. The channel layer 114 may also be formed in the dummy holes 109d. On the cell region 20, the channel layer 114 may be formed to cover the first upper interlayered insulating layer 107, a sidewall of the first gate dielectric pattern 112a, and the exposed top surface of the first semiconductor pattern 111a. On the connection region 30, the channel layer 114 may be formed to cover the top surface of the first upper interlayered insulating layer 107 and side and bottom surfaces of the second gate dielectric pattern 112b. The channel layer 114 may be formed to partially fill the channel holes 109, and thus, an empty space may be formed in the channel holes 109. By contrast, the channel layer 114 may be formed to fill the substantially whole of the dummy holes 109d. For this, the channel layer 114 may be formed in such a way that its deposition thickness is greater than half a short diameter of the dummy holes 109d provided with the second gate dielectric pattern 112b. In this case, the channel layer 114 can be formed to completely fill the dummy holes 109d. The channel layer 114 may be formed using a deposition technique (e.g., an atomic layer deposition technique), allowing for complete filling of a deep and narrow hole with a good step coverage property. Next, the insulating filling layer 116 may be formed on the channel layer 114. On the cell region 20, the insulating filling layer 116 may fill the whole remaining space of the channel holes 109 covered with the channel layer 114.

On the cell region 20, the channel layer 114 may be in direct contact with the top surface of the first semiconductor pattern 111a and may be electrically connected to the substrate 100 through the first semiconductor pattern 111a. On the connection region 30, the channel layer 114 may be electrically insulated from the second semiconductor pattern 111b by the second gate dielectric pattern 112b. The channel layer 114 may be formed of or include a semiconductor material (e.g., poly silicon). The insulating filling layer 116 may be formed of or include an insulating material (e.g., silicon oxide).

Referring to FIGS. 16A through 16D, the insulating filling layer 116 and the channel layer 114 may be removed from the top surface of the first upper interlayered insulating layer 107. Accordingly, the insulating filling pattern 116a and the first vertical channel pattern 114a may be formed in each of the channel holes 109, and the second vertical channel pattern 114b may be formed in each of the dummy holes 109d. The etching process may be performed to expose the top surface of the first upper interlayered insulating layer 107. The etching process may be performed using an etch-back process and/or a polishing process (e.g., a chemical mechanical polishing process).

The vertical channel structures 110a may be formed in the channel holes 109, respectively. Each of the vertical channel structures 110a may include the first gate dielectric pattern 112a, the first vertical channel pattern 114a, and the insulating filling pattern 116a, which are sequentially stacked on the sidewall of the channel hole 109. The first vertical channel pattern 114a may be in direct contact with the first semiconductor pattern 111a and may be electrically connected to the substrate 100 through the first semiconductor pattern 111a.

The dummy pillars 110b may be formed in the dummy holes 109d, respectively. Each of the dummy pillars 110b may include the second gate dielectric pattern 112b and the second vertical channel pattern 114b, which are sequentially stacked on the sidewall of the dummy holes 109d. The second vertical channel pattern 114b may be separated from the second semiconductor pattern 111b by the second gate dielectric pattern 112b and may be electrically insulated from the substrate 100. In example embodiments, the vertical channel structures 110a and the dummy pillars 110b may be simultaneously formed using the same process.

Figure 17:
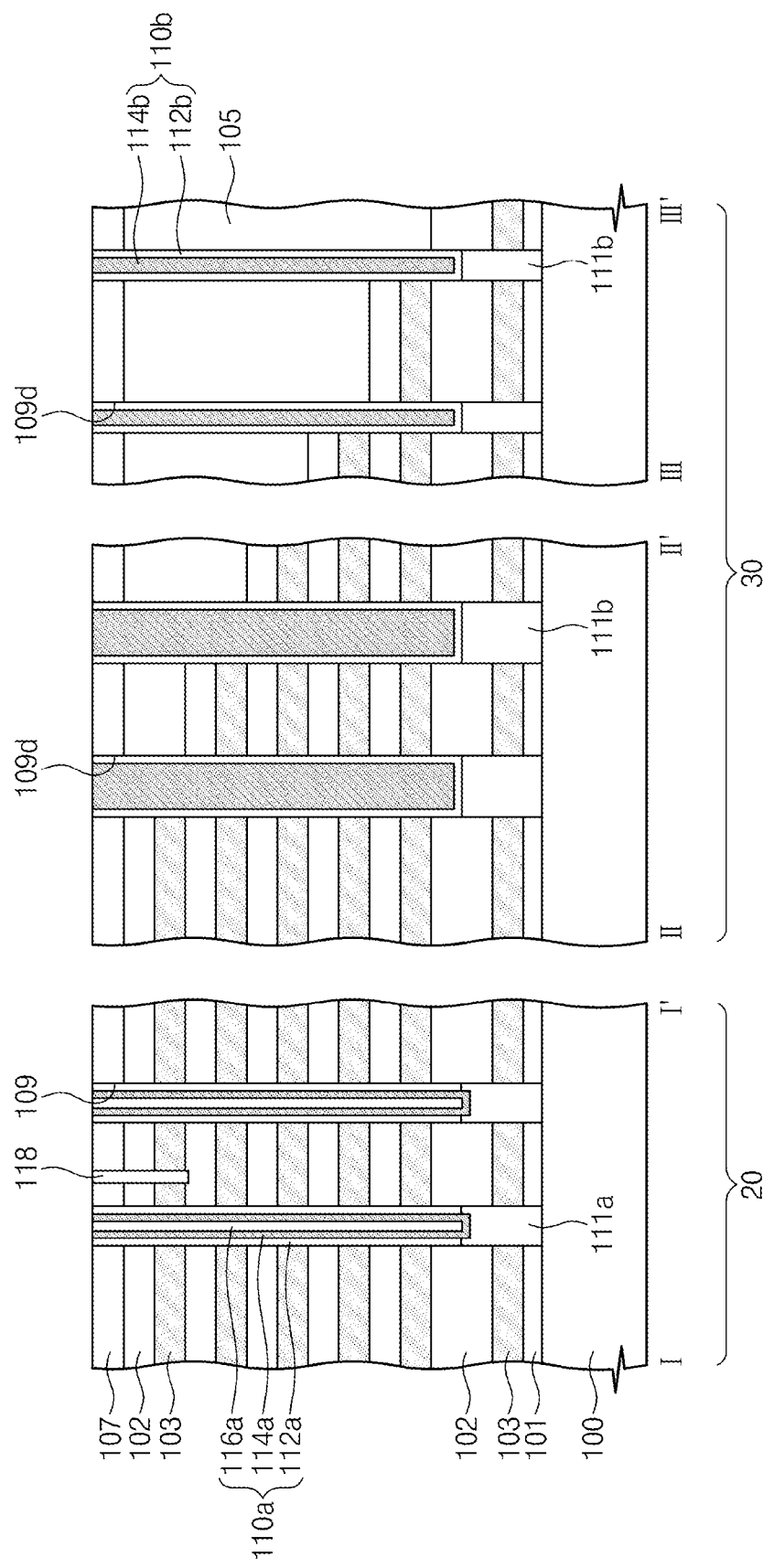

Referring to FIG. 17, the first upper interlayered insulating layer 107, the uppermost one of the interlayered insulating layers 102, and the uppermost one of the sacrificial layers 103 may be patterned to form a cutting trench. The cutting insulating pattern 118 may be formed in the cutting trench. The cutting insulating pattern 118 may extend from the cell region 20 to the connection region 30. The uppermost one of the sacrificial layers 103 may be divided into two line-shaped patterns by the cutting insulating pattern 118 interposed therebetween (e.g., see FIG. 2). The cutting insulating pattern 118 may be formed of or include an insulating material (e.g., silicon oxide).

Figure 18:
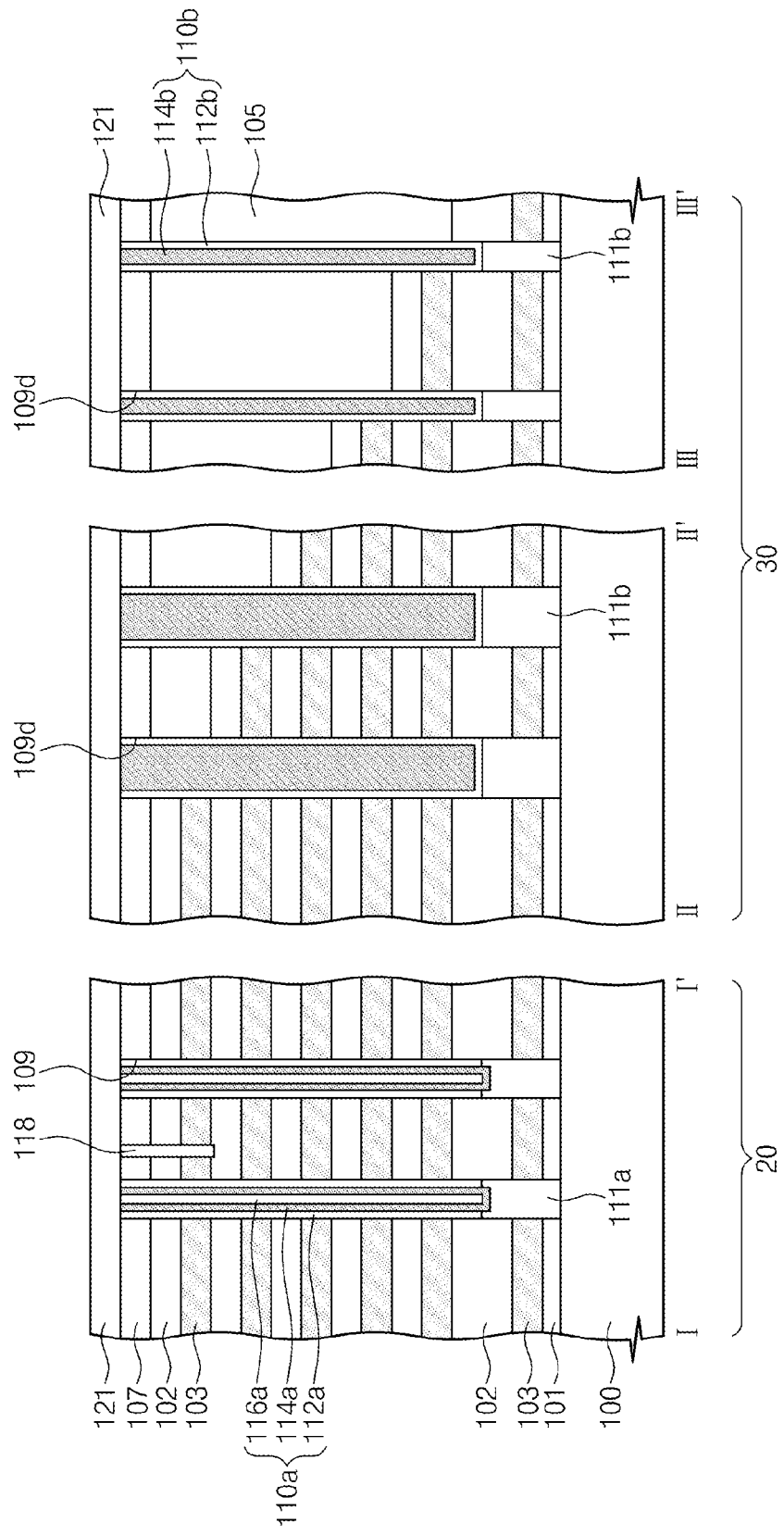

Referring to FIG. 18, the second upper interlayered insulating layer 121 may be formed on the first upper interlayered insulating layer 107, the vertical channel structure 110a, and the dummy pillar 110b. The second upper interlayered insulating layer 121 may be formed of or include the same material as the first upper interlayered insulating layer 107.

Figure 19:
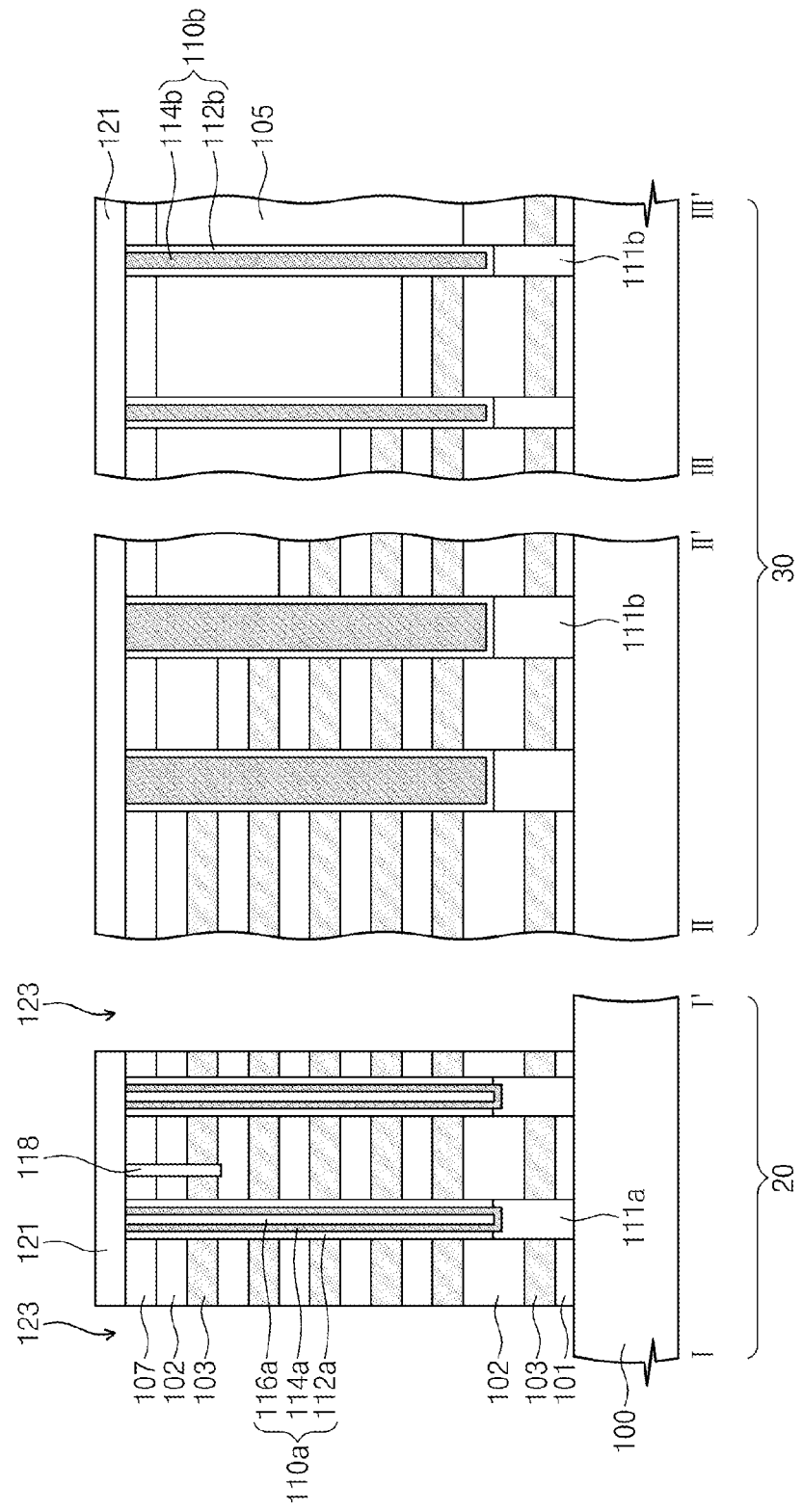

Referring to FIG. 19, a trench 123 may be formed to cut the first and second upper interlayered insulating layers 107 and 121, the interlayered insulating layers 102, and the sacrificial layers 103 between adjacent ones of the vertical channel structures 110a. The trench 123 may be formed to penetrate the interlayered insulating layers 102, the sacrificial layers 103, the buffer insulating layer 101, and the first and second upper interlayered insulating layers 107 and 121 in the vertical direction, thereby exposing the substrate 100. The trench 123 may extend from the cell region 20 to the connection region 30. The trench 123 may be formed spaced apart from the vertical channel structures 110a and dummy pillars 110b to expose side surfaces of the interlayered insulating layers 102, the sacrificial layers 103, the buffer insulating layer 101, and the first and second upper interlayered insulating layers 107 and 121. As shown in FIG. 2, when viewed in a plan view, the trench 123 may have a shape like a line, bar, or rectangle. Further, the trench 123 may be formed to expose the top surface of the substrate 100. In example embodiments, during the formation of the trench 123, the top surface of the substrate 100 exposed by the trench 123 may be over-etched to have a recessed structure. A width of the trench 123 may vary depending on a distance from the substrate 100.

Figure 20:
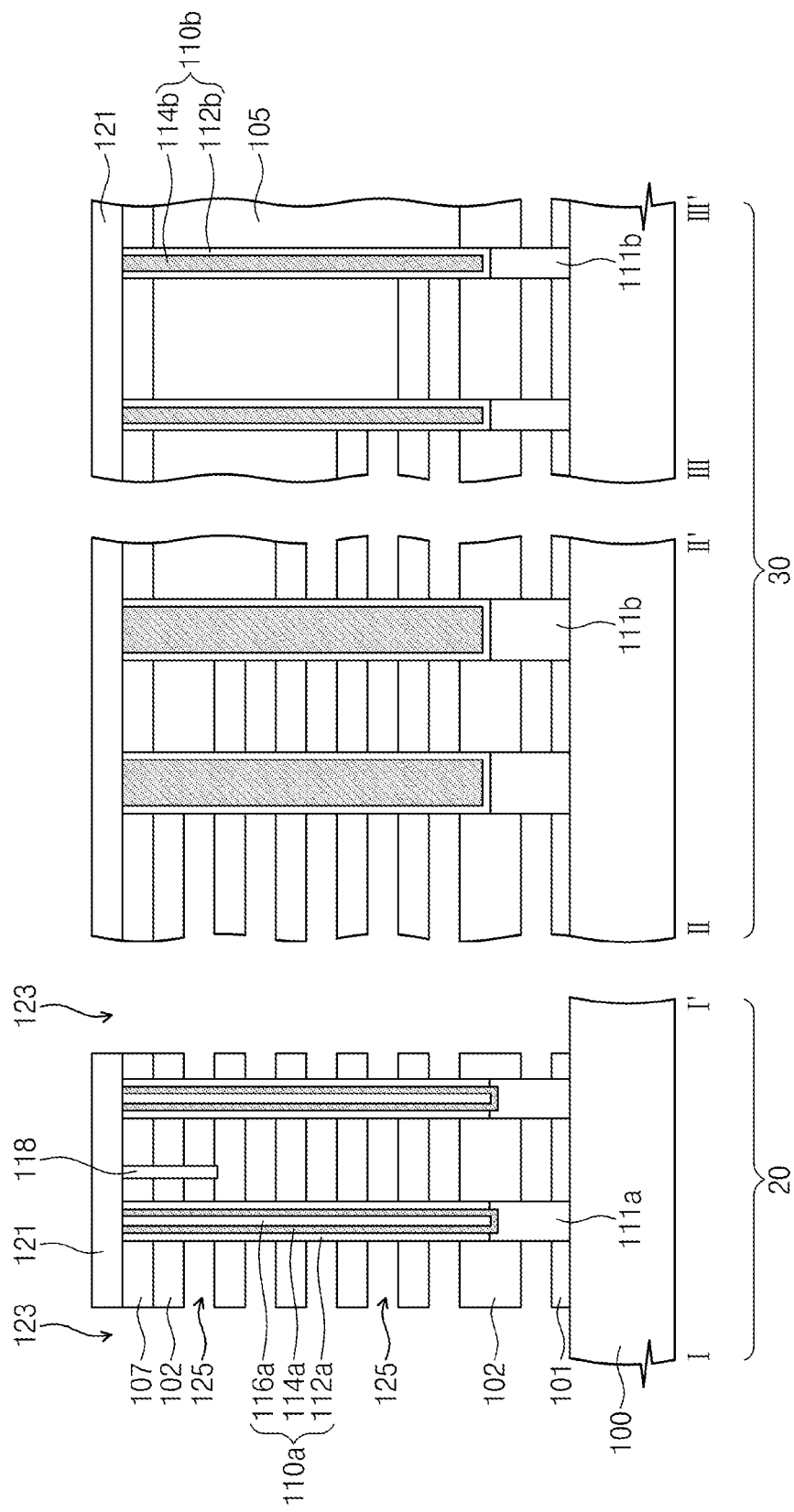

Referring to FIG. 20, the sacrificial layers 103 may be removed by an etching process, and thus, gap regions 125 may be formed between the interlayered insulating layers 102. The etching process may include isotropically etching the sacrificial layers 103 using the trench 123 as an etching pathway. For example, the etching process may be performed using an etching solution, which is prepared to have an etch selectivity with respect to the interlayered insulating layers 102, the first and second upper interlayered insulating layers 107 and 121, and the capping insulating layer 105. As an example, if the sacrificial layers 103 are formed of silicon nitride and the interlayered insulating layers 102, the first and second upper interlayered insulating layers 107 and 121, and the capping insulating layer 105 are formed of silicon oxide, the etching solution may contain phosphoric acid. Each of the gap regions 125 may be an empty space that is horizontally extended from the trench 123 and is formed between the interlayered insulating layers 102. The sidewalls of the vertical channel structures 110a and the dummy pillars 110b may be partially exposed by the gap regions 125.

Figure 21:
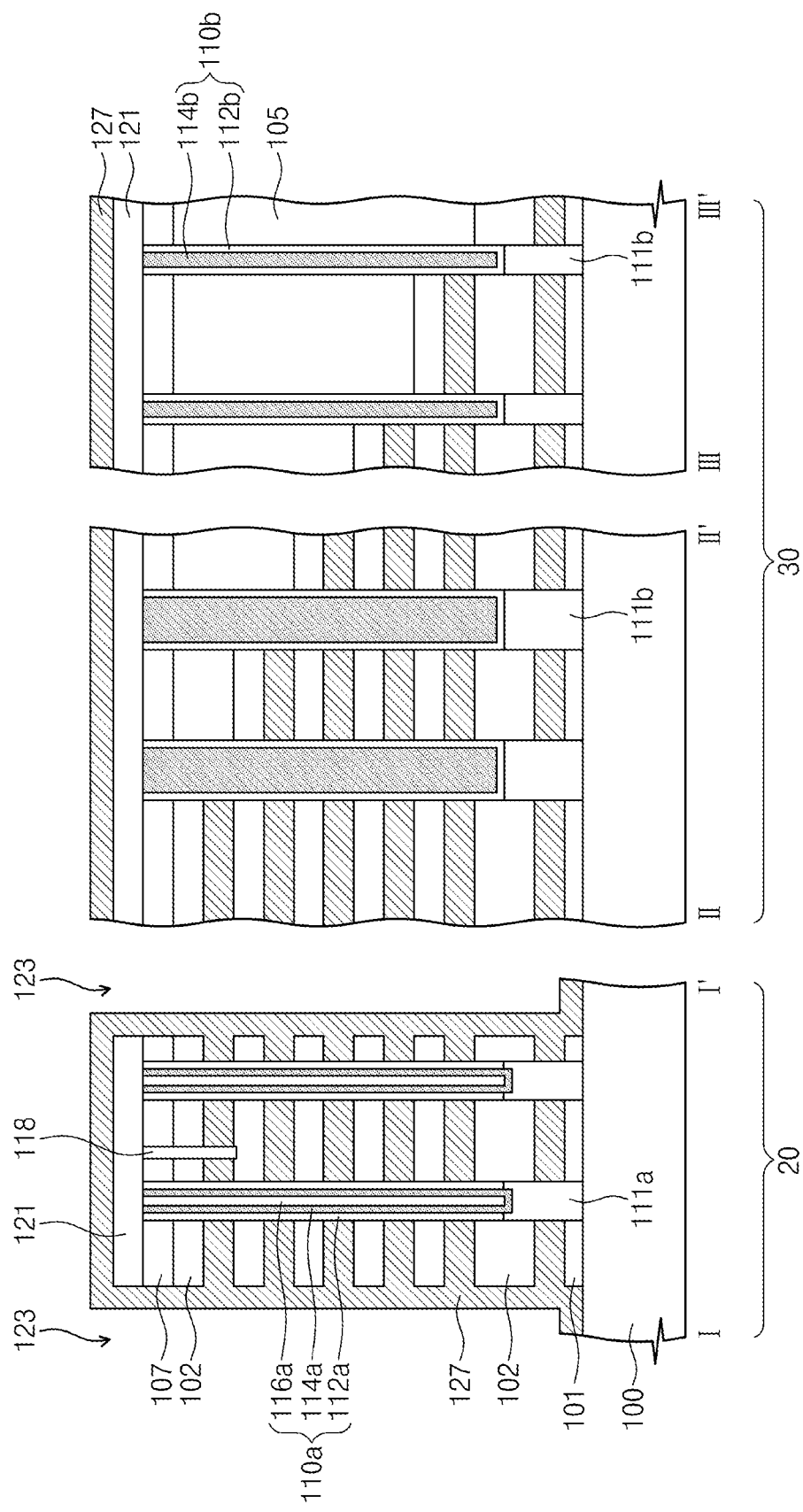

Referring to FIG. 21, a conductive layer 127 may be formed to fill the gap regions 125. The conductive layer 127 may be formed using a deposition technique with a good step coverage property (for example, using a chemical vapor deposition or atomic layer deposition technique). Accordingly, the conductive layer 127 may be formed to fill the gap regions 125 and conformally cover the trench 123 and the second upper interlayered insulating layer 121. The conductive layer 127 may include at least one of doped poly silicon, tungsten, metal nitrides, or metal silicides. In example embodiments, the formation of the conductive layer 127 may include sequentially forming a barrier metal layer (e.g., metal nitride) and a metal layer (e.g., tungsten).

Figure 22:
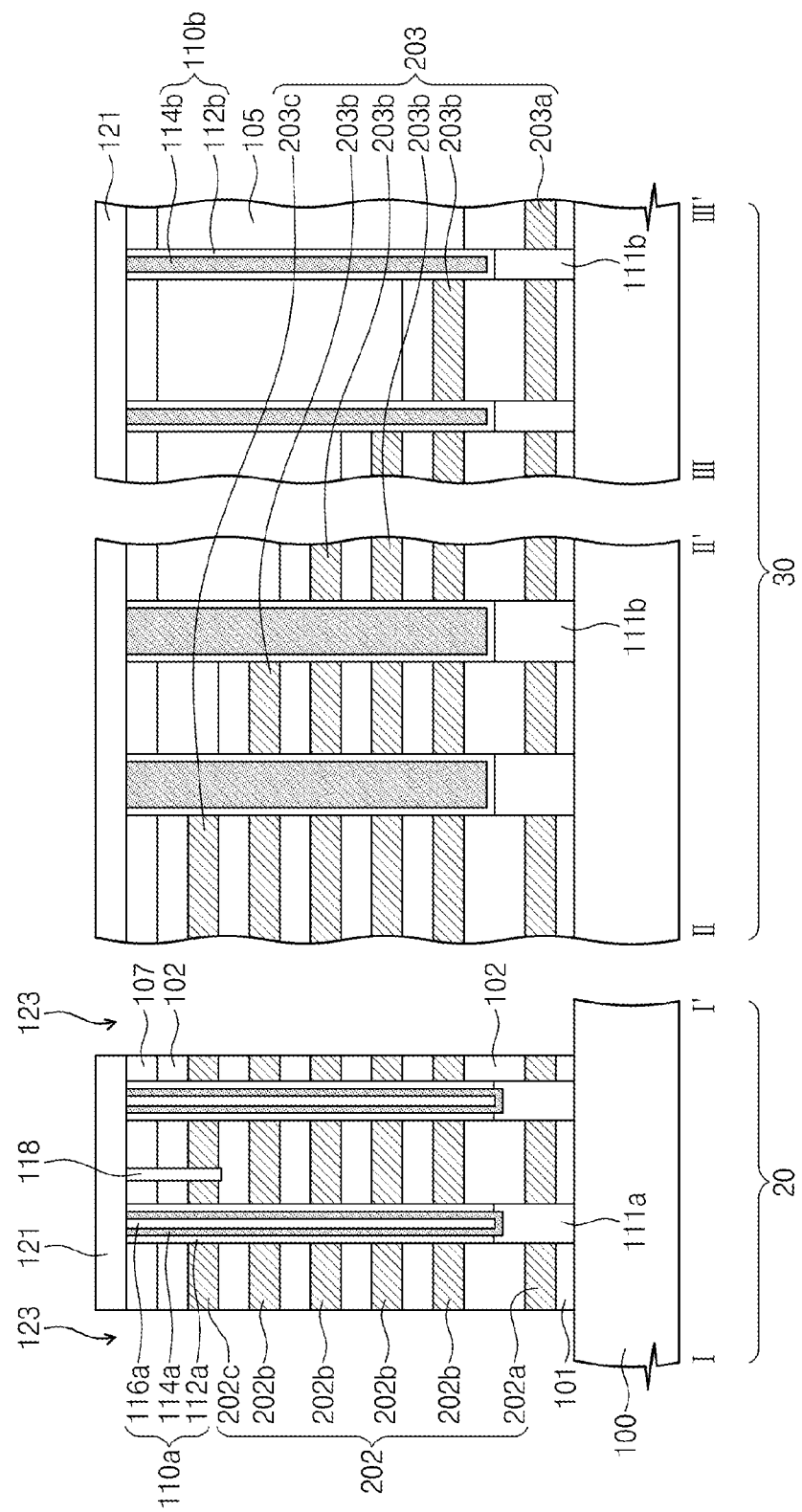

Referring to FIG. 22, the conductive layer 127 may be removed from the trench 123 and the top surface of the second upper interlayered insulating layer 121, thereby forming the gate electrodes 202 and the pads 203 that are separated from each other in the vertical direction. The gate electrodes 202 may be formed on the cell region 20, whereas the pads 203 may be formed on the connection region 30. The pads 203 may be extensions of the gate electrodes 202 that are formed on the connection region 30. The gate electrodes 202 may include the ground selection gate electrode 202a, the string selection gate electrodes 202c, and the cell gate electrodes 202b, which are stacked between the ground and string selection gate electrodes 202a and 202c. The ground selection gate electrode 202a may be the lowermost one of the gate electrodes 202, and the string selection gate electrodes 202c may be the uppermost one of the gate electrodes 202. The string selection gate electrodes 202c may be separated from each other by the cutting insulating pattern 118 (for example, see FIG. 2).

The pads 203 may include the ground selection pad 203a, the string selection pads 203c, and the cell pads 203b, which are stacked between the ground and string selection pads 203a and 203c to form a staircase structure. The ground selection pad 203a may be the lowermost one of the pads 203, and the string selection pads 203c may be the uppermost one of the pads 203. The string selection pads 203c may be separated from each other by the cutting insulating pattern 118, as shown in, for example, FIG. 2.

Since the conductive layer 127 is removed from the trench 123, the top surface of the substrate 100 may be exposed again by the trench 123. An ion implantation process may be performed to form the common source region 131 in the exposed portions of the substrate 100. The formation of the common source region 131 may follow the formation of the gate electrodes 202. In other example embodiments, the common source region 131 may be formed after the formation of the trench 123 but before the removal of the sacrificial layers 103. Similar to the trench 123, when viewed in a plan view, the common source region 131 may be a line-shaped structure extending in the first direction. The common source region 131 may be doped to have a conductivity type of n-type.

Figure 23:
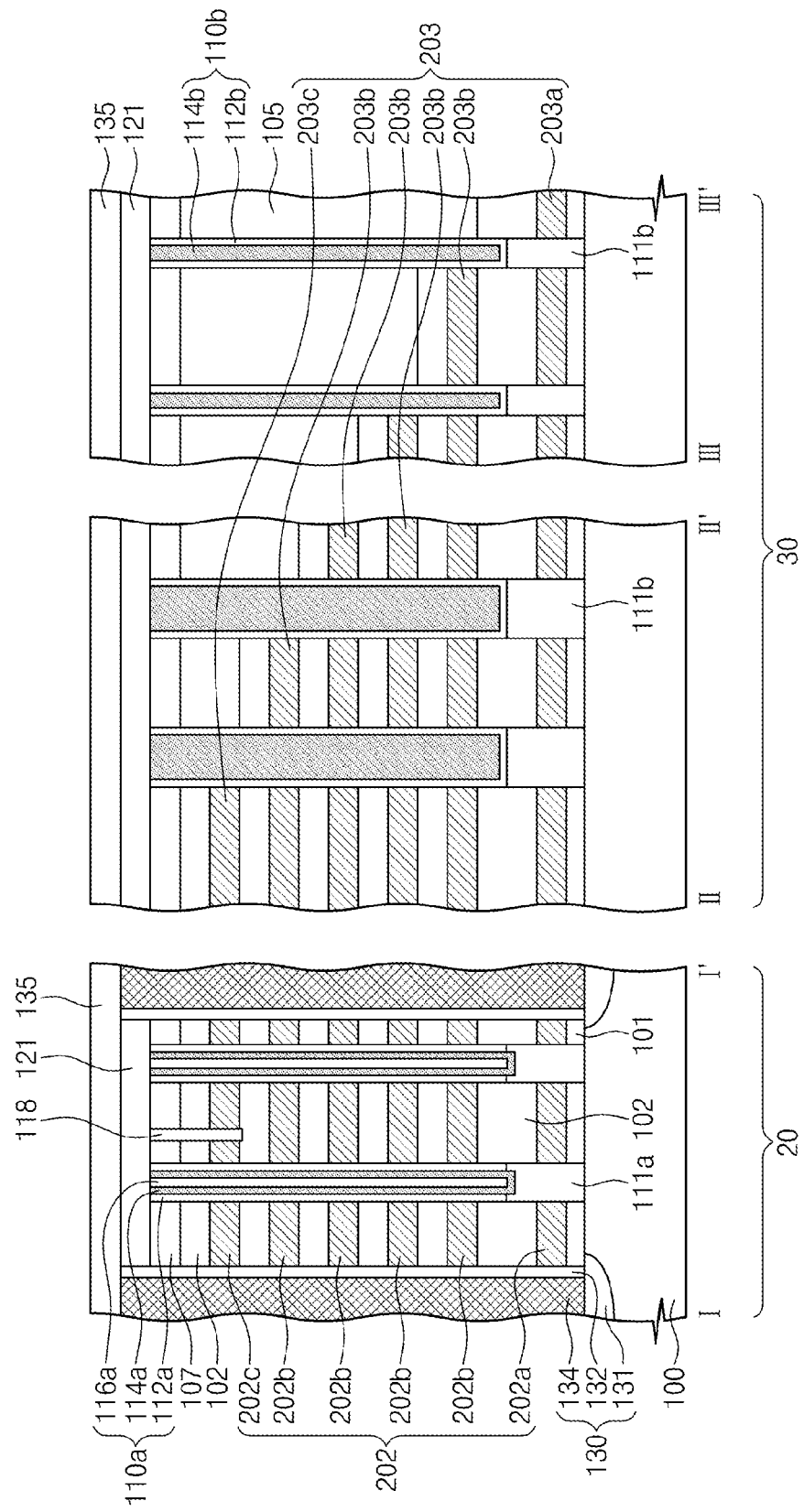

Referring to FIG. 23, the spacer 132 may be formed on the sidewall of the trench 123. The formation of the spacer 132 may include forming an insulating layer to conformally cover the trench 123 and anisotropically etching the insulating layer. The spacer 132 may be formed of or include at least one of silicon oxide, silicon nitride, or silicon oxynitride.

The common source line 134 may be formed in the trench 123 provided with the spacer 132. The formation of the common source line 134 may include filling the trench 123 with a conductive material (e.g., tungsten) and performing an etchback or CMP process on the conductive material. The common source line 134 may be connected to the common source region 131. In example embodiments, the formation of the common source line 134 may include sequentially forming a barrier metal layer (e.g., metal nitride) and a metal layer (e.g., tungsten). When viewed in a plan view, the common source line 134 may be a line-shaped structure extending along the trench 123 or in the first direction. The common source region 131, the spacer 132, and the common source line 134 may constitute the common source structure 130.

Thereafter, the third upper interlayered insulating layer 135 may be formed to cover the whole top surface of the structure provided with the common source line 134.

Figure 24:
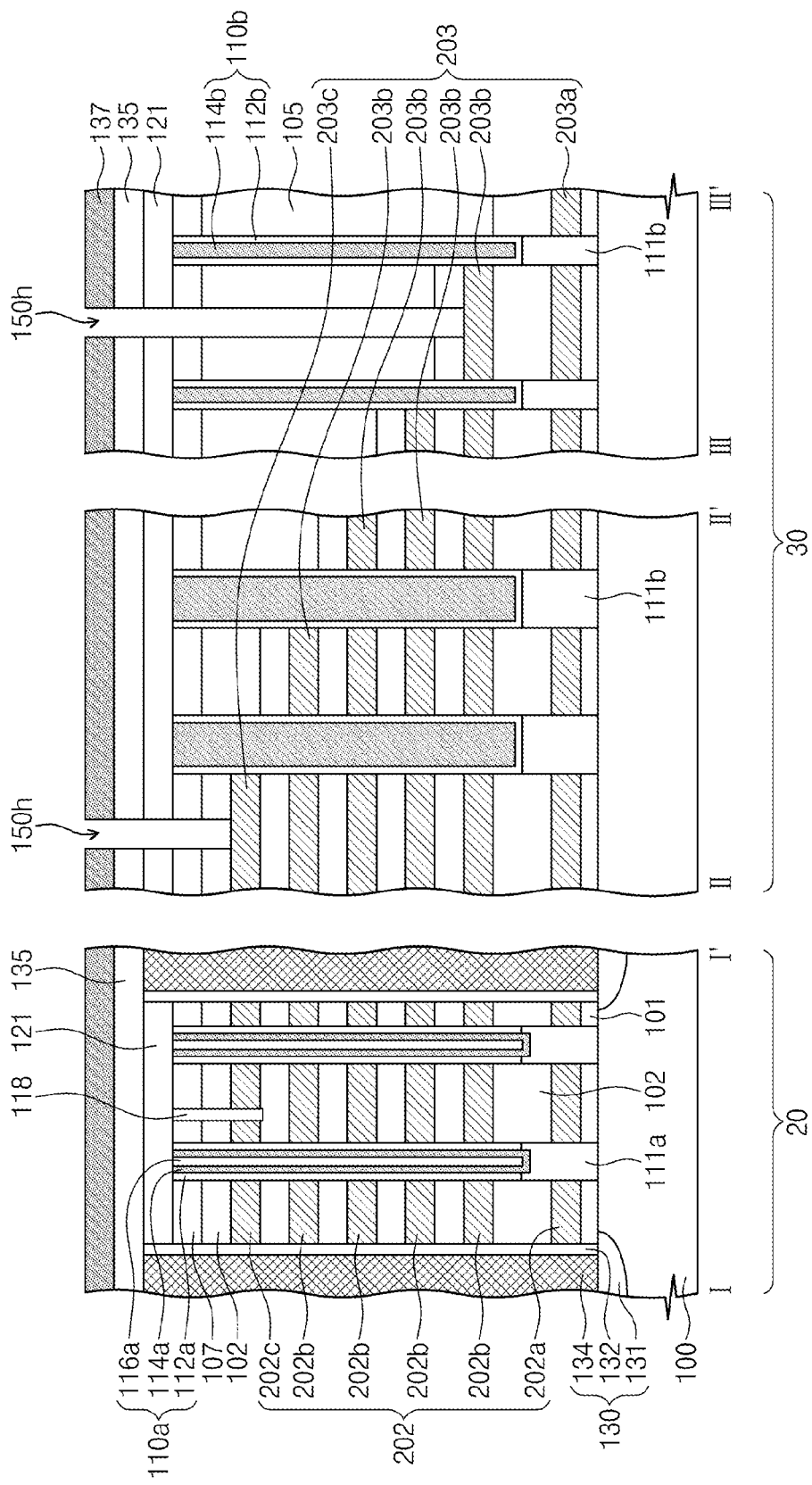

Referring to FIG. 24, an etching process may be performed to form contact holes 150h exposing the pads 203. The etching process may include forming a photoresist pattern 137 on the third upper interlayered insulating layer 135 and anisotropically etching the capping insulating layer 105, the first, second, and third upper interlayered insulating layers 107, 121, and 135, and the interlayered insulating layer 102 using the photoresist pattern 137 as an etch mask. The contact holes 150h may be formed in such a way that at least one thereof is formed on each of the ground selection pad 203a, the cell pads 203b, and the string selection pads 203c. Since the contact holes 150h are formed on the staircase structure of the pads 203, the contact holes 150h may be formed to have different vertical depths. For example, the contact holes 150h may be formed to have the largest depth on the ground selection pad 203a and the smallest depth on the string selection pads 203c.

Thereafter, the contact plugs 150, the fourth upper interlayered insulating layer 152, the first metal lines 151, the connection plugs 154, the second metal lines 155, and the bit lines 160 may be formed, as shown in FIGS. 2 and 3.

The formation of the contact plugs 150 may include filling the contact holes 150h with a conductive material (e.g., copper or tungsten). The contact plugs 150 may include the ground selection plug 150a, the cell plugs 150b, and the string selection plug 150c. The ground selection plug 150a, the cell plugs 150b, and the string selection plug 150c may be electrically connected to the ground selection pad 203a, the cell pads 203b, and the string selection pad 203c, respectively.

The first metal lines 151 may be formed in such a way that each of them is overlapped with at least one of the contact plugs 150, when viewed in plan view. Each of the first metal lines 151 may be connected to the cell plugs 150b or the ground selection plug 150a.

The fourth upper interlayered insulating layer 152 may be formed on the third upper interlayered insulating layer 135 to cover the first metal lines 151 and may be formed of or include an insulating material (e.g., silicon oxide).

On the cell region 20, the connection plugs 154 may be formed to penetrate the second, third, and fourth upper interlayered insulating layers 121, 135, and 152, in the vertical direction, and may connect the vertical channel structures 110a electrically to the bit lines 160. On the connection region 30, the connection plugs 154 may be formed to penetrate the fourth upper interlayered insulating layer 152 in the vertical direction, and may connect the string selection plug 150c electrically to the second metal line 155. The connection plug 154 may include a conductive material (e.g., copper, tungsten, and so forth).

The bit lines 160 and the second metal lines 155 may be formed on the fourth upper interlayered insulating layer 152. The bit lines 160 may be formed to extend across the trench 123 and the gate electrodes 202, whereas the second metal lines 155 may be formed to extend parallel to the trench 123 and the gate electrodes 202. The bit line 160 and the second metal lines 155 may be formed using the same process, thereby containing the same material.

According to example embodiments of inventive concepts, the three-dimensional semiconductor device may include the dummy pillars 110b that are electrically insulated from the second semiconductor pattern 111b or the substrate 100. Accordingly, it is possible to limit (and/or prevent) a leakage current, which may be caused by process failures, such as a dielectric breakdown and physical defects, from occurring between the dummy pillars 110b and the contact plugs 150. In other words, the dummy pillar 110b on the connection region 30 can be limited (and/or prevented) from being used as a pathway for a leakage current. This makes it possible to realize the three-dimensional semiconductor device with good electric characteristic.

Figure 25:
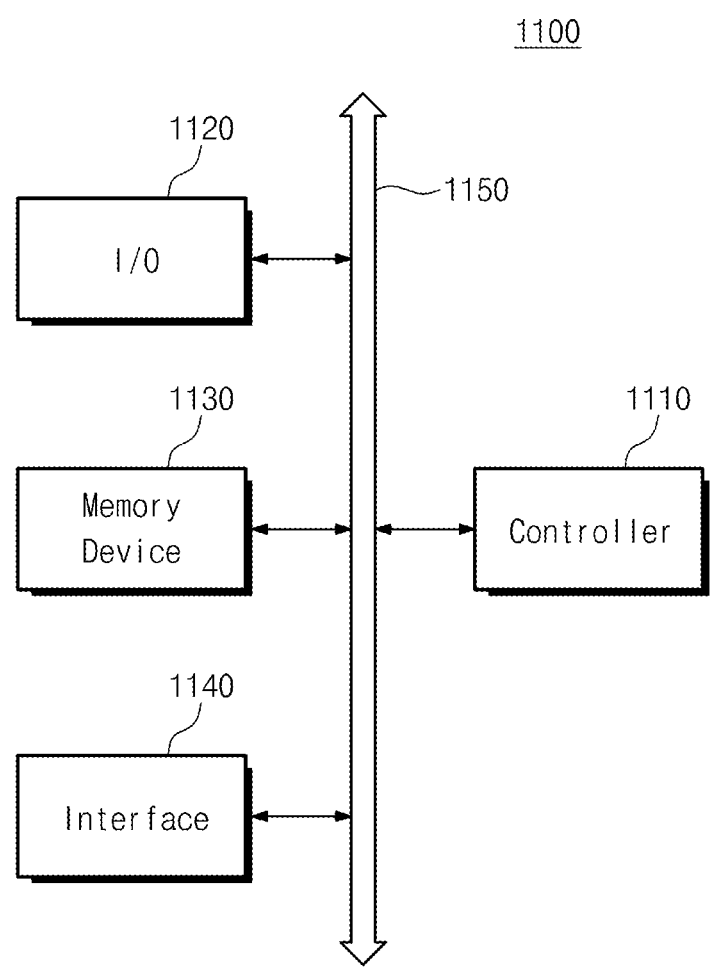
FIG. 25 is a schematic block diagram illustrating an example of electronic systems including a three-dimensional semiconductor device according to example embodiments of inventive concepts.

FIG. 25 is a schematic block diagram illustrating an example of electronic systems including the three-dimensional semiconductor device according to example embodiments of inventive concepts. Referring to FIG. 25, an electronic system 1100 according to example embodiments of inventive concepts may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other via the data bus 1150. The data bus 1150 may correspond to a path through which electrical signals are transmitted.

The controller 1110 may include at least one of a microprocessor, a digital signal processor, a microcontroller, or other logic device, which is configured to have a similar function to any one of the microprocessor, the digital signal processor, and the microcontroller. The I/O unit 1120 may include a keypad, a keyboard or a display unit. The memory device 1130 may store data and/or commands. In example embodiments, the memory device 1130 may include at least one of the three-dimensional semiconductor devices described above. In addition, the memory device 1130 may further include at least one of a dynamic random access memory (DRAM), a static random access memory (SRAM), a magnetic RAM, or a phase-changeable memory device. For example, the memory device 1130 may be a nonvolatile memory device including at least one of the afore-described semiconductor devices. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data wirelessly.

Figure 26:
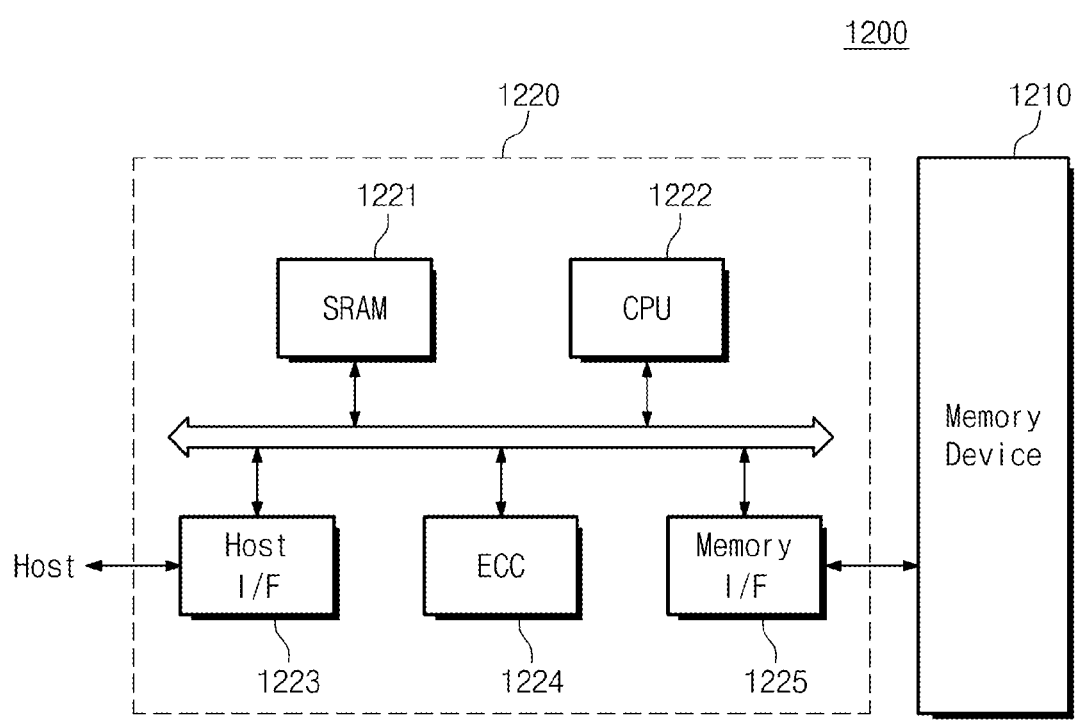
FIG. 26 is a schematic block diagram illustrating an example of memory systems including a three-dimensional semiconductor device according to the embodiments of inventive concepts.

FIG. 26 is a schematic block diagram illustrating an example of memory systems including the three-dimensional semiconductor device according to the embodiments of inventive concepts.

Referring to FIG. 26, a memory system 1200 according to example embodiments of inventive concepts may include a memory device 1210. The memory device 1210 may include at least one of the three-dimensional semiconductor devices described above. In addition, the memory device 1210 may further include at least one of a dynamic random access memory (DRAM), a static random access memory (SRAM), a magnetic RAM, or a phase-changeable memory device. The memory system 1200 may include a memory controller 1220 that controls data communication between a host and the memory device 1210.

The memory controller 1220 may include a processing unit 1222 that controls overall operations of the memory system 1200. The memory controller 1220 may include an SRAM device 1221 used as an operation memory of the processing unit 1222. Moreover, the memory controller 1220 may further include a host interface unit 1223 and a memory interface unit 1225. The host interface unit 1223 may be configured to include a data communication protocol between the memory system 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory system 1200 may further include a read only memory (ROM) device that stores code data to interface with the host. The memory system 1200 may be used as a portable data storage card. Alternatively, the memory system 1200 may be provided in the form of solid state disks (SSD), instead of hard disks of computer systems.

According to example embodiments of inventive concepts, a three-dimensional semiconductor device may include a plurality of gate electrodes stacked on a substrate, pads extending laterally from the gate electrodes, and contact plugs electrically connected to the pads. Further, the device may further include dummy pillars provided near the contact plugs. Here, the dummy pillars are electrically insulated from the substrate, and thus, it is possible to limit (and/or prevent) a leakage current, which may be caused by process failures, such as a dielectric breakdown and physical defects, from occurring between the dummy pillars and the contact plugs. In other words, the dummy pillars can be limited (and/or prevented) from being used as a pathway for a leakage current. As a result, it is possible to realize the three-dimensional semiconductor device with good electric characteristics.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments of inventive concepts have been particularly shown and described, it will be understood by one of ordinary skill in the art that variations in form and detail may be made therein without departing from the spirit and scope of the attached claims.

What is claimed is:

1. A three-dimensional semiconductor device, comprising:
a substrate including a cell region and a connection region;
gate electrodes stacked on top of each other on the cell region of the substrate, the gate electrodes including a lowermost gate electrode;
a vertical channel structure penetrating the gate electrodes on top of the lowermost gate electrode, the vertical channel structure including a first gate dielectric pattern;
pads extended from the gate electrodes, the pads stacked on top of each other on the connection region of the substrate, the pads including a lowermost pad;
a dummy pillar penetrating at least some of the pads on top of the lowermost pad, the dummy pillar including a second gate dielectric pattern;
a first semiconductor pattern between the vertical channel structure and the substrate,
the first gate dielectric pattern of the vertical channel structure on the first semiconductor pattern, the first semiconductor pattern penetrating the lowermost gate electrode; and
a second semiconductor pattern between the dummy pillar and the substrate, the second semiconductor pattern penetrating the lowermost pad, the second gate dielectric pattern of the dummy pillar covering a whole top surface of the second semiconductor pattern.

2. The device of claim 1, wherein the vertical channel structure further includes a first vertical channel pattern and an insulating filling pattern on the first gate dielectric pattern.

3. The device of claim 2, wherein
the first vertical channel pattern is in direct contact with the first semiconductor pattern, and
the first vertical channel pattern is electrically connected to the substrate through the first semiconductor pattern.

4. The device of claim 1, wherein the dummy pillar further includes a second vertical channel pattern on the second gate dielectric pattern.

5. The device of claim 4, wherein
the second gate dielectric pattern defines an inner space of the dummy pillar, and the
second vertical channel pattern completely fills the inner space of the dummy pillar defined by the second gate dielectric pattern.

6. The device of claim 1, wherein the dummy pillar is on or across a boundary between adjacent ones of the pads.

7. The device of claim 1, wherein the vertical channel structure has a circular top surface, and the dummy pillar has an elliptical top surface.

8. The device of claim 7, wherein a short diameter of the elliptical top surface of the dummy pillar is in a range from 50% to 90% of a diameter of the circular top surface of the vertical channel structure.

9. The device of claim 1, wherein the vertical channel structure and the dummy pillar have circular top surfaces.

10. The device of claim 9, wherein a diameter of the circular top surface of the dummy pillar is smaller than or equal to 50% of a diameter of the circular top surface of the vertical channel structure.

11. The device of claim 1, wherein the pads have horizontal lengths decreasing in a direction away from the substrate.

12. The device of claim 1, further comprising:
contact plugs electrically connected to the pads.

13. A three-dimensional semiconductor device, comprising:
- a substrate including a cell region and a connection region;
- gate electrodes stacked on top of each other on the cell region of the substrate, the gate electrodes defining a part of a channel hole that exposes a part of the cell region of the substrate, the gate electrodes being separated from each other in a vertical direction;
- pads extended from the gate electrodes, the pads stacked on top of each other on the connection region of the substrate, at least some of the pads defining a part of a dummy hole that exposes a part of the connection region of the substrate;
- a first semiconductor pattern on the cell region of the substrate in a lower portion of the channel hole, a top surface of the first semiconductor pattern including a recessed dent; and
- a second semiconductor pattern on the connection region of the substrate in a lower portion of the dummy hole, a top surface of the second semiconductor pattern being flat.

14. The device of claim 13, further comprising:
a vertical channel structure on the first semiconductor pattern over the cell region of the substrate.

15. The device of claim 13, further comprising:
a dummy pillar on the second semiconductor pattern over the connection region of the substrate.

16. A three-dimensional semiconductor device, comprising:
- a substrate including a cell region and a connection region;
- a plurality of conductive layers stacked on top of each other on the substrate and spaced apart from each other in a vertical direction, the conductive layers each including a gate electrode portion over the cell region and a pad portion over the connection region;
- a first semiconductor pattern on a part of the cell region, the first semiconductor pattern extending vertically through the gate electrode portion of a lowermost conductive layer among the plurality of conductive layers;
- a first vertical channel pattern extending vertically through the gate electrode portions of the conductive layers over the lowermost conductive layer, the first vertical channel pattern electrically connected to the first semiconductor pattern;
- a second semiconductor pattern on a part of the connection region and extending vertically through the pad portion of the lowermost conductive layer; and
- a dummy gate dielectric pattern extending vertically through the pad portions of some of the conductive layers over the lowermost conductive layer, the dummy gate dielectric pattern covering a whole top surface of the second semiconductor pattern.

17. The device of claim 16, further comprising:
a cell region gate dielectric pattern between the first vertical channel pattern and the gate electrode portions of the conductive layers on the lowermost conductive layer, wherein the cell region gate dielectric pattern is on top of the first semiconductor pattern.

18. The device of claim 17, wherein
the cell region gate dielectric pattern and the first vertical channel pattern define a vertical channel structure,
the vertical channel structure has a circular top surface,
an outer periphery of the dummy gate dielectric pattern has an elliptical top surface.

19. The device of claim 18, wherein a short diameter of the elliptical top surface of the outer periphery of the dummy gate dielectric pattern is in a range from 50% to 90% of a diameter of the circular top surface of the vertical channel structure.

20. The device of claim 16, wherein the pad portions of the conductive layers define a staircase structure over the connection region.